United States Patent
Sano et al.

(10) Patent No.: US 6,248,497 B1
(45) Date of Patent: Jun. 19, 2001

(54) LIGHT-SENSITIVE AND HEAT-SENSITIVE RECORDING MATERIAL

(75) Inventors: Shojiro Sano; Masanobu Takashima, both of Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/537,676

(22) Filed: Mar. 29, 2000

(30) Foreign Application Priority Data

Mar. 31, 1999 (JP) .................................................. 11-093513
Oct. 13, 1999 (JP) .................................................. 11-290367

(51) Int. Cl.$^7$ ..................................................... B03F 7/016
(52) U.S. Cl. ......................... 430/138; 430/157; 430/177; 430/179
(58) Field of Search ..................................... 430/138, 157, 430/177, 179

(56) References Cited

U.S. PATENT DOCUMENTS 3,769,018 * 10/1973 Hectors ................................. 430/157
4,540,648 * 9/1985 Scheler ................................. 430/172
4,895,826 * 1/1990 Watanabe et al. .................... 503/202

FOREIGN PATENT DOCUMENTS 62-55188   3/1987 (JP) ................................. B41M/5/18

* cited by examiner

Primary Examiner—John S. Chu
(74) Attorney, Agent, or Firm—Sughrue, Mion, Zinn, Macpeak & Seas, PLLC

(57) ABSTRACT

A light-sensitive and heat-sensitive recording material containing a diazo compound and a coupling component or a coupler, in which a density of a recorded image and a whiteness of a base portion are both improved. The recording material includes a recording layer disposed on a substrate. The recording layer preferably contains the diazo compound in the form of a diazonium salt and enclosed in micro-capsules together with an acylphosphine oxide compound, wherein the diazonium salt is reactive with the coupler.

12 Claims, No Drawings

LIGHT-SENSITIVE AND HEAT-SENSITIVE RECORDING MATERIAL

BACKGROUND OF THE INVENTION

1. Field of the Invention

The present invention relates to a light-sensitive and heat-sensitive recording material, and particularly to a diazo compound based light-sensitive and heat-sensitive recording material on which an image can be fixed.

2. Description of the Related Art

A diazonium salt compound is a compound having extremely high chemical activity, and reacts with a compound (which is called a coupler) having a phenol derivative or an active methylene group, to easily form an azo dye. Further, a diazonium salt compound also has photosensitivity, and is decomposed by irradiation with light and loses its activity. Therefore, diazonium salt compounds have been conventionally used for a long time as light recording materials as represented by diazo copy (see "Shashin-Kougaku no Kiso—Hi-gin-en Shashin Hen (Fundamentals of Photographic Engineering—Non-silver Salt Photography Section)", pp. 89 to 117, 182 to 201, edited by the Photographic Society of Japan, Corona Publishing Co., Ltd. 1982).

Further, in recent years, diazonium salt compounds are also applied to recording materials on which fixation of an image is required, by utilizing its nature in which it is decomposed and loses activity due to action of light. As a typical example, there has been proposed a light fixation type light-sensitive and heat-sensitive recording material in which a diazonium salt compound and a coupler are heated in accordance with an image signal so as to be reacted to form an image, and thereafter, the image is fixed by irradiation with light (Hirotsugu Sato et al., Bulletin of the Image Electronics Society, Vol. 11, No. 4 (1982) pp. 290 to 296, and the like).

However, this recording material in which a diazonium salt compound is used as a color forming element has a drawback in that a shelf life thereof as a recording material is short since the activity of the diazonium salt compound is extremely high and the diazonium salt compound is thermally decomposed gradually to lose its reactivity even in a dark place. As one of the means for solving the drawback, there is suggested a method in which a diazonium salt compound is enclosed in a micro capsule. In this method, the diazonium salt compound can be isolated from materials which promote decomposition, such as water, a base, and the like. Therefore, the shelf life of the diazonium salt compound as a recording material can be greatly increased (Tomomasa Usami et al., Bulletin of the Electronic photography Society, Vol. 26, No. 2 (1987), pp. 115 to 125).

In a case in which a micro capsule has a wall composed of a material having a glass transition temperature such as a urea resin or urethane resin, which glass transition temperature is slightly higher than room temperature, this micro capsule is called a heat-responsive micro capsule and is useful for a light-sensitive and heat-sensitive recording material since the capsule wall is impermeable with respect to materials at room temperature and is permeable with respect to materials at a temperature equivalent to or greater than the glass transition temperature thereof. Namely, by preparing the recording material in which a heat-sensitive recording layer including a coupler, a base, and the heat-responsive micro capsule which contains a diazonium salt compound is applied to a substrate, the diazonium salt compound can be stably kept for a long period of time, and a color formation image can be easily formed by heating. Further, an image can be fixed by irradiation with light.

As described above, stability of a diazonium salt compound can be remarkably improved by enclosing the compound in a micro capsule.

However, even in the light-sensitive and heat-sensitive recording material in which the compound is enclosed in a micro capsule, various photo-dissociative reaction products are formed during diazo decomposition in a fixing process, and coloring (so-called photo-dissociative stain) having an absorptivity, particularly in a visible region, may occur. Further, when such recording materials are exposed to the sun or a fluorescent light for a long time after fixing of an image, the density of the non-image portion (a base portion) also becomes higher and the whiteness of the recording paper may remarkably decrease.

Further, heat development-type recording materials using diazonium salt compounds also have a drawback in that after optical writing and heat development, photo-dissociative stain occurs in a non-image portion to thereby cause deterioration in the whiteness of the base portion, in the same manner as in the above-described light-sensitive and heat-sensitive recording material.

In order to improve the whiteness of the base portion, for example, Japanese Patent Application Laid-Open (JP-A) No. 62-55188, discloses that a micro capsule containing a diazo compound and a compound which forms free radicals by irradiation with light (that is, aromatic ketones such as benzophenone, 4,4'-bis(dimethylamino)benzophenone, and the like, cyclic aromatic ketones such as fluorenone, anthrone, and the like, quinones such as benzoquinone, 2,3,5-trimethyl-6-bromobenzoquinone, and the like, benzoin, benzoin ethers, aromatic polycyclic hydrocarbons, azos such as azobisisobutyronitrile, organic sulfides such as thiuramdisulfide, and acyloxime esters). By using the above-described compound, which forms free radicals, the whiteness of the base portion after fixing was improved to a certain degree.

However, as advanced light-sensitive and heat-sensitive recording materials have been desired, further improvement has been demanded for the whiteness of the base portion in a fixed light-sensitive and heat-sensitive recording material.

An object of the present invention is to provide a light-sensitive and heat-sensitive recording material containing a diazo compound and a coupling component, in which a density of an image recorded thereon and the whiteness of a base portion are both improved.

SUMMARY OF THE INVENTION

In accordance with a preferred embodiment of the present invention, a light-sensitive and heat-sensitive recording material is provided. The light-sensitive and heat-sensitive recording material includes a substrate and a heat-sensitive recording layer disposed on the substrate. The recording layer contains micro-capsules having a diazonium salt compound therein, along with an acylphosphine compound. The recording layer further contains a coupler reactive with the diazonium salt compound.

The acylphosphine oxide compound is preferably at least one of the compounds represented by the following general formulae (1) and (2):

General formula (1)

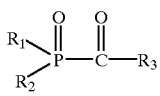

General formula (2)

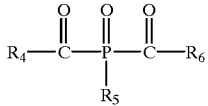

In the above-described general formulae (1) and (2), $R_1$, $R_2$, and $R_5$ each represent an alkyl group, an aryl group, an alkoxy group, an aryloxy group, or a heterocyclic group. $R_3$, $R_4$, and $R_6$ each represent an alkyl group, an aryl group, or a heterocyclic group.

DESCRIPTION OF THE PREFERRED EMBODIMENTS

A light-sensitive and heat-sensitive recording material of the present invention is formed in such a manner that a heat-sensitive recording layer, which contains at least a diazonium salt compound and a coupler reacting with the diazonium salt compound, is applied onto a substrate, the diazonium salt compound being, together with an acylphosphine oxide compound, contained in micro capsules. Since the acylphosphine oxide compound is contained in micro capsules, a light-sensitive and heat-sensitive recording material in which a density of an image recorded thereon, and the whiteness of a base portion are both improved. The acylphosphine oxide compound is preferably selected from the previously-described general formulae (1) and (2) in the summary.

In the foregoing-described general formulae (1) and (2), an alkyl group, an aryl group, a heterocyclic group, an alkoxy group, and an aryloxy group represented by $R_1$, $R_2$, $R_3$, $R_4$, $R_5$, and $R_6$ may each be substituted by an alkyl group, an aryl group, a hydroxy group, a nitro group, a cyano group, a halogen atom, an alkyl sulfonyl group, an aryl sulfonyl group, an alkoxy group, an alkoxycarbonyl group, an aryloxy group, aryloxycarbonyl group, an acyl group, (mono- or dialkyl-)amino group, an acylamino group, a carbamoyl group, a sulphamoyl group, an alkylthio group, or an arylthio group.

An alkyl group represented by $R_1$, $R_2$, $R_3$, $R_4$, $R_5$, or $R_6$ may be saturated or unsaturated, or may be made into a straight-chain, branched, or cyclic structure. Among these, an alkyl group having 1 to 30 carbon atoms is preferable. Specific examples of the alkyl group include a methyl group, an ethyl group, a propyl group, a butyl group, a hexyl group, an octyl group, a decyl group, an octadecyl group, a phenoxyethyl group, and a cyclohexyl group. However, the present invention is not limited to the same.

An aryl group represented by $R_1$, $R_2$, $R_3$, $R_4$, $R_5$, or $R_6$ preferably has 6 to 30 carbon atoms, and particularly, a phenyl group, a naphthyl group, and the like are preferably used. Specific examples include a phenyl group, 2-methylphenyl group, 2,4-dimethylphenyl group, 2,4,6-trimethylphenyl group, 2-methoxyphenyl group, 2,6-dimethoxyphenyl group, 2,6-dichlorophenyl group, and the like. However, the present invention is not limited to the same.

A heterocyclic group represented by $R_1$, $R_2$, $R_3$, $R_4$, $R_5$, and $R_6$ preferably include an N, O, or S atom, and examples thereof include a pyridyl group, a furyl group, a thienyl group, an imidazolyl group, and a pyrolyl group.

An alkoxy group represented by $R_1$, $R_2$, or $R_5$ preferably has 1 to 30 carbon atoms, and specific examples include a methoxy group, an ethoxy group, a buthoxy group, an octyloxy group, and a phenoxyethoxy group. However, the present invention is not limited to the same.

An aryloxy group represented by $R_1$, $R_2$, or $R_5$ preferably has 6 to 30 carbon atoms, and specific examples include a phenoxy group, a methylphenyloxy group, a chlorophenyloxy group, a methoxyphenyloxy group, and an octyloxyphenyloxy group, but the present invention is not limited to the same.

Specific examples of the acylphosphine oxide compound represented by the above-described general formula (1) include compounds disclosed in Japanese Patent Application Publication (JP-B) Nos. 63-40799 and 5-29234, and JP-A Nos. 10-95788 and 10-29997.

Examples of the acylphosphine oxide compound used in the present invention include the following compounds, but the acylphosphine oxide compound of the present invention is not limited to the same.

(1)

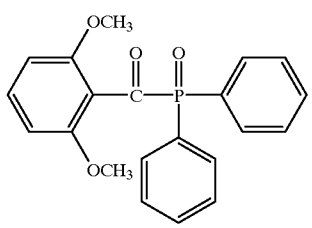

(2)

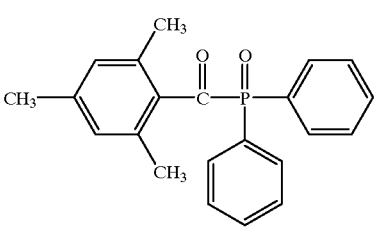

(3)

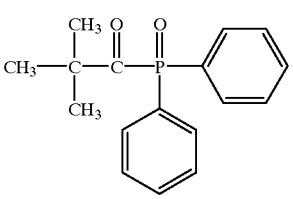

(4)

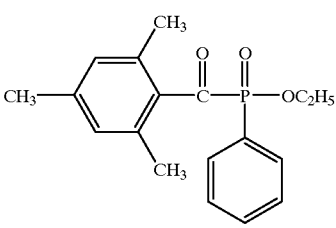

(5) 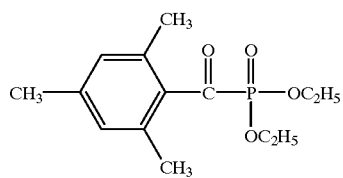
(6) 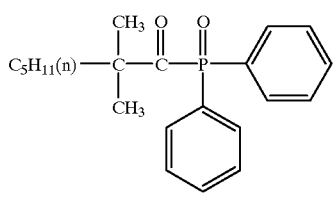
(7) 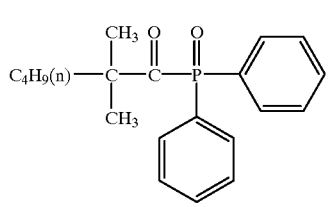
(8) 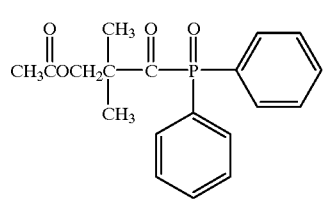
(9) 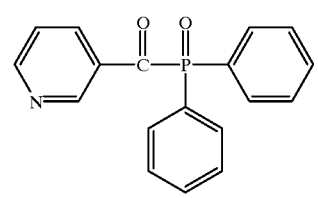
(10) 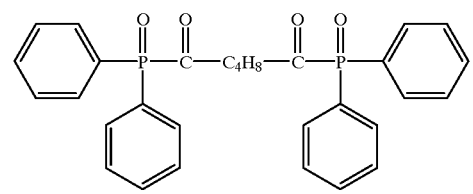
(11) 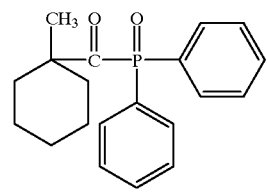
(12) 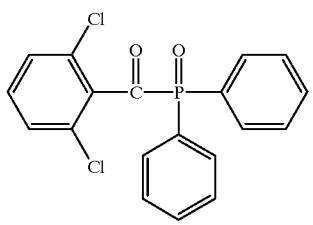
(13) 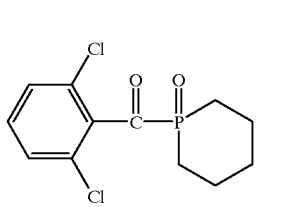
(14) 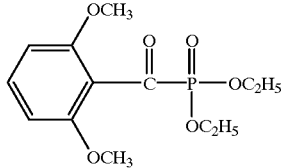
(15) 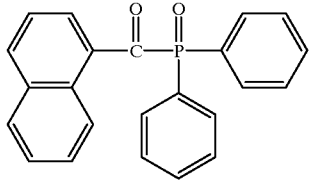
(16) 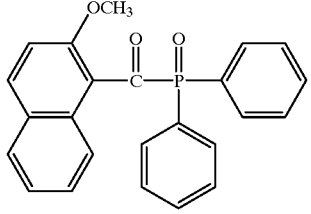
(17) 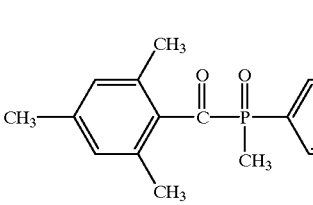
(18) 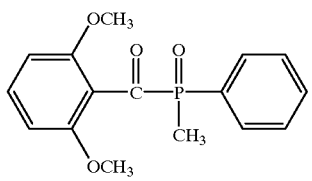

-continued

(19) 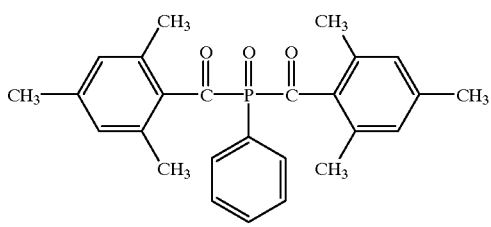

(20) 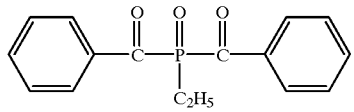

(21) 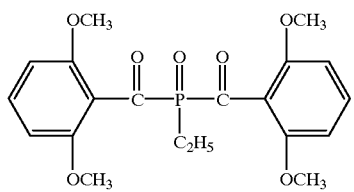

(22) 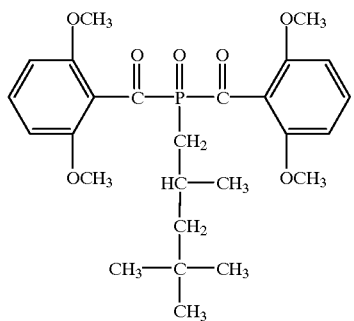

(23) 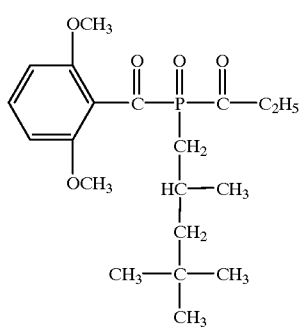

(24) 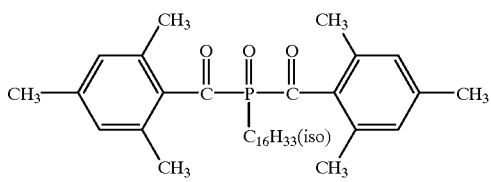

(25) 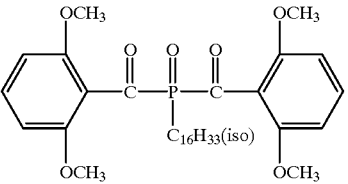

(26) 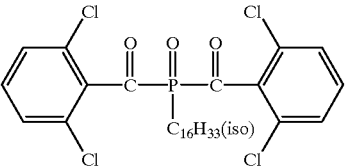

The amount of acylphosphine oxide compound used in the present invention is in the range from 1 to 50% by weight, preferably in the range from 5 to 20% by weight, based on the total weight of the diazonium salt compound.

If the amount is less than 1% by weight, improvement in the whiteness of a base portion cannot be expected. If it exceeds 50% by weight, the improvement in the whiteness stagnates, and fogging during long periods is apt to increase. For this reason, the amount of addition is preferably set in the above-described range.

Next, a description will be given of a diazonium salt compound and a coupler which are color forming elements used for the above-described heat-sensitive recording layer in the present invention.

Examples of the above-described diazonium salt compound are shown below. These compounds are those whose maximum absorption wavelength can be controlled by the position and type of the substituent of the Ar part.

Diazonium salt compound

The diazonium salt compound used in the present invention is a compound represented by the following general formula:

$$Ar—N_2^+X^-$$

(wherein Ar represents an aromatic part, and $X^-$ represents an acid anion). The diazonium salt compound causes coupling reaction with a coupler due to heating so as to form a color, and is decomposed by light. The maximum absorption wavelength of the compound can be controlled by the position and type of the substituent on the Ar part.

Specific examples of salt-forming diazonium include 4-(p-tolylthio)-2,5-dibutoxybenzenediazonium, 4-(4-chlorophenylthio)-2,5-dibutoxybenzenediazonium, 4-(N,N-dimethylamino)benzenediazonium, 4-(N,N-diethylamino)benzenediazonium, 4-(N,N-dipropylamino)benzenediazonium, 4-(N-methyl-N-benzylamino)benzenediazonium, 4-(N,N-dibenzylamino)benzenediazonium, 4-(N-ethyl-N-hydroxyethylamino)benzenediazonium, 4-(N,N-diethylamino)-3-methoxybenzenediazonium, 4-(N,N-dimethylamino)-2-methoxybenzenediazonium, 4-(N-benzoylamino)-2,5-diethoxybenzenediazonium, 4-morpholino-2,5- dibutoxybenzenediazonium, 4-anilinobenzenediazonium, 4-[N-(4-methoxybenzoyl)amino]-2,5-diethoxybenzenediazonium, 4-pyrrolidino-3-ethylbenzenediazonium, 4-[N- (1-methyl-2-(4-methoxyphenoxy)ethyl)-N-hexylamino]-2-hexyloxybenzenediazonium, 4-[N-(2-(4-methoxyphenoxy)ethyl)-N-hexylamino]-2-hexyloxybenzenediazonium, 2-(1-ethylpropyloxy)-4-[di-(di-n-butylaminocarbonylmethyl)amino]benzenediazonium, and 2-benzylsulfonyl-4-[N-methyl-N-(2-octanoyloxyethyl)]aminobenzenediazonium.

The maximum absorption wavelength $\lambda_{max}$ of the diazonium salt compound used in the present invention is preferably 450 nm or less from the standpoint of effectiveness, more preferably in the range from 290 to 440 nm. Diazonium salt compounds each having the maximum absorption wavelength $\lambda_{max}$ higher than the above-described wavelength range are not preferable from the standpoint of storability before image recording. Further, diazonium salt compounds each having the maximum absorption wavelength $\lambda_{max}$ lower than the above-described wavelength range are not preferable from the standpoint of image fixing characteristics, image storability, and hue of formed cyan color when the diazonium salt compound is used in combination with a coupler.

The diazonium salt compound used in the present invention preferably has 12 or more carbon atoms, and the solubility thereof in water is preferably 1% or less and the solubility thereof in ethyl acetate is preferably 5% or more.

Among these diazonium salt compounds, the compounds represented by the following constitutional formulae (2), (3), and (4) are preferably used from the standpoints of hues of dyes, image storability, and image fixing characteristics.

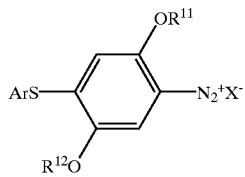

Constitutional formula (2)

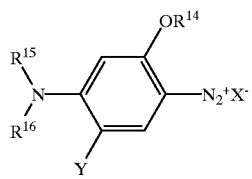

Constitutional formula (3)

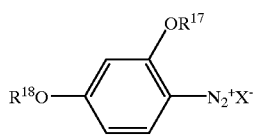

Constitutional formula (4)

In the above-described constitutional formula (2), Ar represents a substituted or unsubstituted aryl group.

Examples of the substituent include an alkyl group, an alkoxy group, an alkylthio group, an aryl group, an aryloxy group, an arylthio group, an acyl group, an alkoxycarbonyl group, a carbamoyl group, a carboamide group, a sulfonyl group, a sulfamoyl group, a sulfonamide group, an ureido group, a halogen group, an amino group, and a heterocyclic group. These substituents may further be substituted.

As the aryl group represented by Ar, an aryl group having 6 to 30 carbon atoms is preferable. Examples of the aryl group include a phenyl group, 2-methylphenyl group, 2-chlorophenyl group, 2-methoxyphenyl group, 2-butoxyphenyl group, 2-(2-ethylhexyloxy)phenyl group, 2-octyloxyphenyl group, 3-(2,4-di-t-pentylphenoxyethoxy) phenyl group, 4-chlorophenyl group, 2,5-dichlorophenyl group, 2,4,6-trimethylphenyl group, 3-chlorophenyl group, 3-methylphenyl group, 3-methoxyphenyl group, 3-butoxyphenyl group, 3-cyanophenyl group, 3-(2-ethylhexyloxy)phenyl group, 3,4-dichlorophenyl group, 3,5-dichlorophenyl group, 3,4-dimethoxyphenyl group, 3-(dibutylaminocarbonylmethoxy)phenyl group, 4-cyanophenyl group, 4-methylphenyl group, 4-methoxyphenyl group, 4-butoxyphenyl group, 4-(2-ethylhexyloxy)phenyl group, 4-benzylphenyl group, 4-aminosulfonylphenyl group, 4-N,N-dibutylaminosulfonylphenyl group, 4-ethoxycarbonylphenyl group, 4-(2-ethylhexylcarbonyl)phenyl group, 4-fluorophenyl group, 3-acetylphenyl group, 2-acetylaminophenyl group, 4-(4-chlorophenylthio)phenyl group, 4-(4-methylphenyl)thio-2,5-butoxyphenyl group, and 4-(N-benzyl-N-methylamino)-2-dodecyloxycarbonylphenyl group. However, the present invention is not limited to the same. Further, these groups may further be substituted by an alkyloxy group, an alkylthio group, a substituted phenyl group, a cyano group, a substituted amino group, a halogen atom, a heterocyclic group, or the like.

$R^{11}$ and $R^{12}$ each represent a substituted or unsubstituted alkyl group, or a substituted or unsubstituted aryl group. $R^{11}$ and $R^{12}$ may be the same or different from each other.

Examples of the substituent include an alkoxy group, an alkoxycarbonyl group, an alkylsulfonyl group, a substituted amino group, a substituted amide group, an aryl group, and an aryloxy group. However, the present invention is not limited to the same.

When $R^{11}$ and $R^{12}$ each represent an alkyl group, an alkyl group having 1 to 18 carbon atoms is preferably used as the alkyl gorup. Examples of the alkyl group include a methyl group, a trifluoromethyl group, an ethyl group, a propyl group, an isopropyl group, a butyl group, a sec-butyl group, t-butyl group, a pentyl group, an isopentyl group, a cyclopentyl group, a hexyl group, a cyclohexyl group, an octyl group, a t-octyl group, 2-ethylhexyl group, a nonyl group, an octadecyl group, a benzyl group, 4-methoxybenzyl group, a triphenylmethyl group, an ethoxycarbonylmethyl group, a butoxycarbonylmethyl group, 2-ethylhexyloxycarbonylmethyl group, 2',4'-diisopentylphenyloxymethyl group, 2',4'-di-t-butylphenyloxymethyl group, dibenzylaminocarbonylmethyl group, 2,4-di-t-amylphenyloxypropyl group, an ethoxycarbonylpropyl group, 1-(2',4'-di-t-amylphenyloxy)propyl group, an acetylaminoethyl group, 2-(N,N-dimethylamino)ethyl group, 2-(N,N-diethylamino)propyl group, a methanesulfonylaminopropyl group, an acetylamino ethyl group, 2-(N,N-dimethylamino)ethyl group, and 2-(N,N-diethylamino)propyl group.

When $R^{11}$ and $R^{12}$ each represent an aryl group, an aryl group having 6 to 30 carbon atoms is preferably used as the aryl group. Examples of the aryl group include a phenyl group, 2-methylphenyl group, 2-chlorophenyl group, 2-methoxyphenyl group, 2-butoxyphenyl group, 2-(2-ethylhexyloxy)phenyl group, 2-octyloxyphenyl group, 3-(2,4-di-t-pentylphenoxyethoxy) phenyl group, 4-chlorophenyl group, 2,5-dichlorophenyl group, 2,4,6-trimethylphenyl group, 3-chlorophenyl group, 3-methylphenyl group, 3-methoxyphenyl group, 3-butoxyphenyl group, 3-cyanophenyl group, 3-(2-ethylhexyloxy)phenyl group, 3,4-dichlorophenyl group, 3,5-dichlorophenyl group, 3,4-dimethoxyphenyl group, 3-(dibutylaminocarbonylmethoxy) phenyl group, 4-cyanophenyl group, 4-methylphenyl group, 4-methoxyphenyl group, 4-butoxyphenyl group, 4-(2-ethylhexyloxy)phenyl group, 4-benzylphenyl group, 4-aminosulfonylphenyl group, 4-N,N-dibutylaminosulfonylphenyl group, 4-ethoxycarbonylphenyl group, 4-(2-ethylhexylcarbonyl)phenyl group, 4-fluorophenyl group, 3-acetylphenyl group, 2-acetylaminophenyl group, 4-(4-chlorophenylthio)phenyl group, 4-(4-methylphenyl) thio-2,5-butoxyphenyl group, and 4-(N-benzyl-N-methylamino)-2-dodecyloxycarbonylphenyl group. However, the present invention is not limited to the same. Further, these groups may further be substituted by an alkyloxy group, an allylthio group, a substituted phenyl group, a cyano group, a substituted amino group, a halogen atom, a heterocyclic group, and the like.

In the above-described constitutional formula (3), $R^{14}$, $R^{15}$, and $R^{16}$ each represent a substituted or unsubstituted alkyl group, or a substituted or unsubstituted aryl group. $R^{14}$, $R^{15}$, and $R^{16}$ may be the same or different from each other.

Examples of the substituent include an alkyl group, an alkoxy group, an alkylthio group, an aryl group, an aryloxy group, an arylthio group, an acyl group, an alkoxycarbonyl group, a carbamoyl group, a carboamide group, a sulfonyl group, a sulfamoyl group, a sulfonamide group, an ureide group, a halogen atom, an amino group, and a heterocyclic group.

When $R^{14}$, $R^{15}$, and $R^{16}$ each represent an alkyl group, an alkyl group having 1 to 18 carbon atoms is preferably used as the alkyl group. Examples of the alkyl group include a methyl group, trifluoromethyl group, ethyl group, propyl group, isopropyl group, butyl group, sec-butyl group, t-butyl group, bentyl group, isopentyl group, cyclopentyl group, hexyl group, cyclohexyl group, octyl group, t-octyl group, 2-ethylhexyl group, nonyl group, octadecyl group, benzyl group, 4-methoxybenzyl group, triphenylmethyl group, ethoxycarbonylmethyl group, butoxycarbonylmethyl group, 2-ethylhexyloxycarbonylmethyl group, 2',4'-diisopentylphenyloxymethyl group, 2',4'-di-t-butylphenyloxymethyl group, dibenzylaminocarbonylmethyl group, 2,4-di-t-amylphenyloxypropyl group, ethoxycarbonylpropyl group, 1-(2',4'-di-t-amylphenyloxy)propyl group, acetylaminoethyl group, 2-(N,N-dimethylamino) ethyl group, 2-(N,N-diethylamino)propyl group, methanesulfonylaminopropyl group, acetylaminoethyl group, 2-(N,N-dimethylamino) ethyl group, 2-(N,N-diethylamino)propyl group, 1-methyl-2-(4-methoxyphenoxy)ethyl group, di-n-butylaminocarbonylmethyl group, and di-n-octylaminocarbonylmethyl group.

When $R^{14}$, $R^{15}$, and $R^{16}$ each represent an aryl group, an aryl group having 6 to 30 carbon atoms is preferably used as the aryl gorup. Examples of the aryl group include a phenyl group, 2-methylphenyl group, 2-chlorophenyl group, 2-methoxyphenyl group, 2-butoxyphenyl group, 2-(2-ethylhexyloxy)phenyl group, 2-octyloxyphenyl group, 3-(2, 4-di-t-pentylphenoxyethoxy)phenyl group, 4-chlorophenyl group, 2,5-dichlorophenyl group, 2,4,6-trimethylphenyl group, 3-chlorophenyl group, 3-methylphenyl group, 3-methoxyphenyl group, 3-butoxyphenyl group, 3-cyanophenyl group, 3-(2-ethylhexyloxy)phenyl group, 3,4-dichlorophenyl group, 3,5-dichlorophenyl group, 3,4-dimethoxyphenyl group, 3-(dibutylaminocarbonylmethoxy) phenyl group, 4-cyanophenyl group, 4-methylphenyl group, 4-methoxyphenyl group, 4-butoxyphenyl group, 4-(2-ethylhexyloxy)phenyl group, 4-benzylphenyl group, 4-aminosulfonylphenyl group, 4-N,N-dibutylaminosulfonylphenyl group, 4-ethoxycarbonylphenyl group, 4-(2-ethylhexylcarbonyl) phenyl group, 4-fluorophenyl group, 3-acetylphenyl group, 2-acetylaminophenyl group, 4-(4-chlorophenylthio)phenyl group, 4-(4-methylphenyl)thio-2,5-butoxyphenyl group, and 4-(N-benzyl-N-methylamino)-2-dodecyloxycarbonylphenyl group. However, the present invention is not particularly limited to the same. These groups may further be substituted by an alkyloxy group, an alkylthio group, a substituted phenyl group, a cyano group, a substituted amino group, a halogen group, a heterocyclic group, or the like.

In the above-described constitutional formula (3), Y represents a hydrogen atom or —$OR^{13}$ group. In the —$OR^{13}$ group, $R^{13}$ represents a substituted or unsubstituted alkyl group, or a substituted or unsubstituted aryl group.

Examples of the substituents include an alkyl group, an alkoxy group, an alkylthio group, an aryl group, an aryloxy group, an arylthio group, an acyl group, an alkoxycarbonyl group, a carbamoyl group, a carboamide group, a sulfonyl group, a sulfamoyl group, a sulfonamide group, a ureide group, a halogen atom, an amino group, and a heterocyclic group. From the standpoint of controlling hue, Y preferably represents a hydrogen atom or an alkyloxy group in which $R^{13}$ represents an alkyl group.

When $R^{13}$ in the —$OR^{13}$ group represents an alkyl group, an alkyl group having 1 to 18 carbon atoms is preferably used as the alkyl group. Examples of the alkyl group include a methyl group, a trifluoromethyl group, an ethyl group, a propyl group, an isopropyl group, a butyl group, sec-butyl group, t-butyl group, a pentyl group, an isopentyl group, a cyclopentyl group, a hexyl group, a cyclohexyl group, an octyl group, t-octyl group, 2-ethylhexyl group, a nonyl group, an octadecyl group, a benzyl group, 4-methoxybenzyl group, a triphenylmethyl group, an ethoxycarbonylmethyl group, a butoxycarbonylmethyl group, 2-ethylhexyloxycarbonylmethyl group, 2',4'-diisopentylphenyloxymethyl group, 2',4'-di-t-butylphenyloxymethyl group, a dibenzylaminocarbonylmethyl group, 2,4-di-t-amylphenyloxypropyl group, an ethoxycarbonylpropyl group, 1-(2',4'-di-t-amylphenyloxy) propyl group, an acetylaminoethyl group, 2-(N,N-dimethylamino)ethyl group, 2-(N,N-diethylamino)propyl group, a methanesulfonylaminopropyl group, an acetylaminoethyl group, 2-(N,N-dimethylamino)ethyl group, and 2-(N,N-diethylamino)propyl.

When $R^{13}$ in the —$OR^{13}$ represents an aryl group, an aryl group having 6 to 30 carbon atoms is preferably used as the aryl group. Examples of the aryl group include a phenyl group, 2-methylphenyl group, 2-chlorophenyl group, 2-methoxyphenyl group, 2-butoxyphenyl group, 2-(2-ethylhexyloxy)phenyl group, 2-octyloxyphenyl group, 3-(2, 4-di-t-pentylphenoxyethoxy)phenyl group, 4-chlorophenyl group, 2,5-dichlorophenyl group, 2,4,6-trimethylphenyl group, 3-chlorophenyl group, 3-methylphenyl group, 3-methoxyphenyl group, 3-butoxyphenyl group, 3-cyanophenyl group, 3-(2-ethylhexyloxy)phenyl group, 3,4-dichlorophenyl group, 3,5-dichlorophenyl group, 3,4-dimethoxyphenyl group, 3-(dibutylaminocarbonylmethoxy) phenyl group, 4-cyanophenyl group, 4-methylphenyl group, 4-methoxyphenyl group, 4-butoxyphenyl group, 4-(2-ethylhexyloxy)phenyl group, 4-benzylphenyl group, 4-aminosulfonylphenyl group, 4-N,N-dibutylaminosulfonylphenyl group, 4-ethoxycarbonylphenyl group, 4-(2-ethylhexylcarbonyl)

phenyl group, 4-fluorophenyl group, 3-acetylphenyl group, 2-acetylaminophenyl group, 4-(4-chlorophenylthio)phenyl group, 4-(4-methylphenyl) thio-2,5-butoxyphenyl group, and 4-(N-benzyl-N-methylamino)-2-dodecyloxycarbonylphenyl group. However, the present invention is not particularly limited to the same. These groups may further be substituted by an alkyloxy group, an alkylthio group, a substituted phenyl group, a cyano group, a substituted amino group, a halogen atom, a heterocyclic group, or the like.

In the above-described constitutional formula (4), $R^{17}$ and $R^{18}$ each represent a substituted or unsubstituted alkyl group, or a substituted or unsubstituted aryl group. $R^{17}$ and $R^{18}$ may be the same or different from each other.

Examples of the substituents include an alkyl group, an alkoxy group, an alkylthio group, an aryl group, an aryloxy group, an arylthio group, an acyl group, an alkoxycarbonyl group, a carbamoyl group, a carboamide group, a sulfonyl group, a sulfamoyl group, a sulfonamide group, a ureide group, a halogen atom, an amino group, and a heterocyclic group.

When $R^{17}$ and $R^{18}$ each represent an alkyl group, an alkyl group having I to 18 carbon atoms is preferably used as the alkyl group. Examples of the alkyl group include a methyl group, a trifluoromethyl group, an ethyl group, a propyl group, an isopropyl group, a butyl group, sec-butyl group, t-butyl group, pentyl group, isopentyl group, cyclopentyl group, a hexyl group, cyclohexyl group, an octyl group, t-octyl group, 2-ethylhexyl group, nonyl group, an octadecyl group, a benzyl group, 4-methoxybenzyl group, triphenylmethyl group, an ethoxycarbonylmethyl group, butoxycarbonylmethyl group, 2-ethylhexyloxycarbonylmethyl group, 2',4'-diisobentylphenyloxymethyl group, 2',4'-di-t-butylphenyloxymethyl group, dibenzylaminocarbonylmethyl group, 2,4-di-t-amylphenyloxypropyl group, an ethoxycarbonylpropyl group, 1-(2',4'-di-t-amylphenyloxy) propyl group, an acetylaminoethyl group, 2-(N,N-dimethylamino)ethyl group, 2-(N,N-diethylamino)propyl group, a methanesulfonylaminopropyl group, an acetylaminoethyl group, 2-(N,N-dimethylamino)ethyl group, and 2-(N,N-diethylamino)propyl group, but the present invention is not particularly limited to the same.

When $R^{17}$ and $R^{18}$ each represent an aryl group, an aryl group having 6 to 30 carbon atoms is preferably used. Examples of the aryl group include a phenyl group, 2-methylphenyl group, 2-chlorophenyl group, 2-methoxyphenyl group, 2-butoxyphenyl group, 2-(2-ethylhexyloxy)phenyl group, 2-octyloxyphenyl group, 3-(2, 4-di-t-pentylphenoxyethoxy)phenyl group, 4-chlorophenyl group, 2,5-dichlorophenyl group, 2,4,6-trimethylphenyl group, 3-chlorophenyl group, 3-methylphenyl group, 3-methoxyphenyl group, 3-butoxyphenyl group, 3-cyanophenyl group, 3-(2-ethylhexyloxy)phenyl group, 3,4-dichlorophenyl group, 3,5-dichlorophenyl group, 3,4-dimethoxyphenyl group, 3-(dibutylaminocarbonylmethoxy) phenyl group, 4-cyanophenyl group, 4-methylphenyl group, 4-methoxyphenyl group, 4-butoxyphenyl group, 4-(2-ethylhexyloxy)phenyl group, 4-benzylphenyl group, 4-aminosulfonyl phenyl group, 4-N,N-dibutylaminosulfonylphenyl group, 4-ethoxycarbonylphenyl group, 4-(2-ethylhexylcarbonyl) phenyl group, 4-fluorophenyl group, 3-acetylphenyl group, 2-acetylaminophenyl group, 4-(4-chlorophenylthio)phenyl group, 4-(4-methylphenyl) thio-2, 5-butoxyphenyl group, and 4-(N-benzyl-N-methylamino)-2-dodecyloxycarbonylphenyl group. These groups may further be substituted by an alkyloxy group, an alkylthio group, a substituted phenyl group, a cyano group, a substituted amino group, a halogen atom, a heterocyclic group, or the like.

In the above-described constitutional formulae (2), (3), and (4), $X^-$ represents an acid anion. Examples of the acid anion include polyfluoroalkylcarboxylic acids having 1 to 9 carbon atoms, polyfluoroalkylsulfonic acids having 1 to 9 carbon atoms, boron tetrafluoride, tetraphenylboron, hexafluorophosphoric acid, aromatic carboxylic acids, and aromatic sulfonic acids. Among these, hexafluorophosphoric acid is preferably used from the viewpoint of crystallinity.

Specific examples of the diazonium salt compounds represented by the above-described constitutional formulae (2), (3), and (4) are the following compounds, but the present invention is not limited to the same.

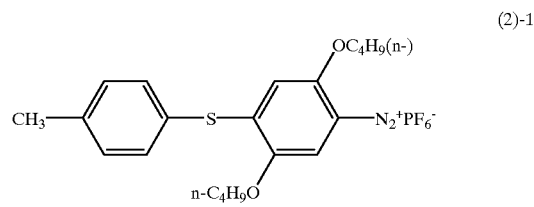

(2)-1

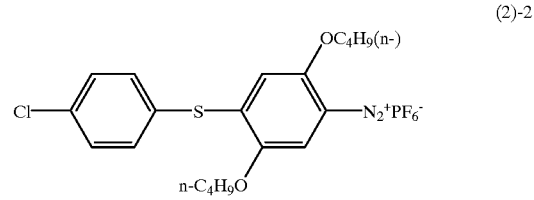

(2)-2

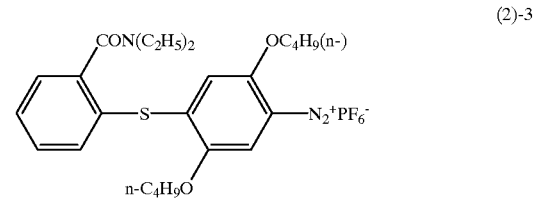

(2)-3

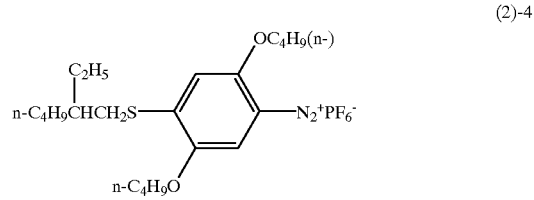

(2)-4

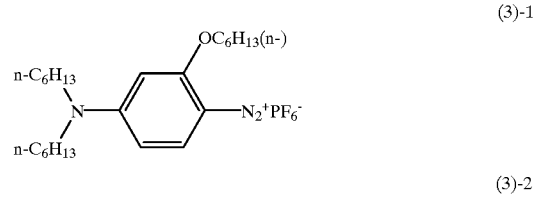

(3)-1

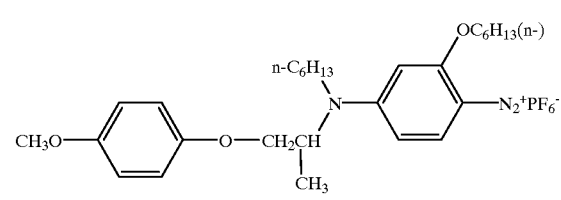

(3)-2

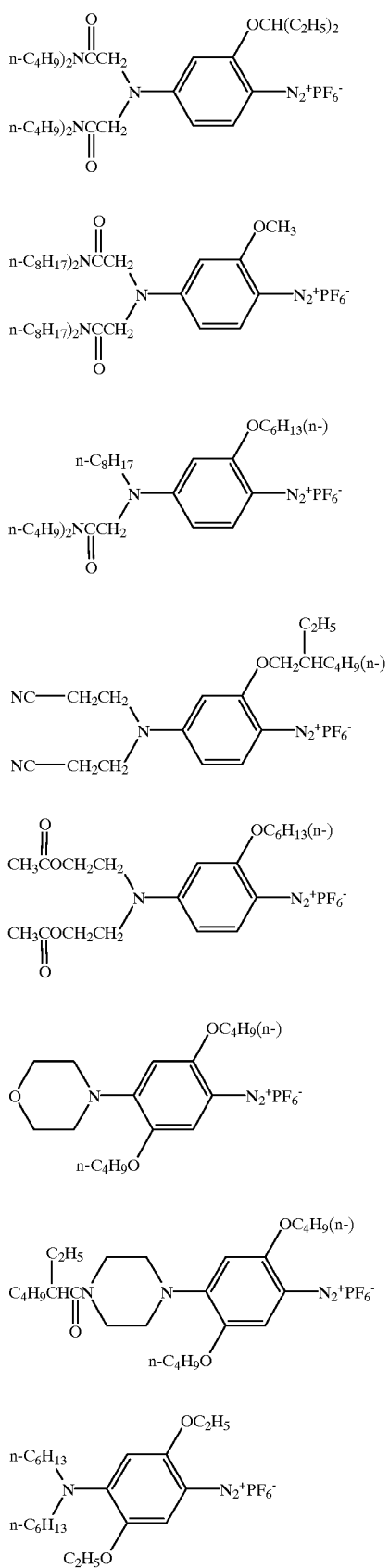

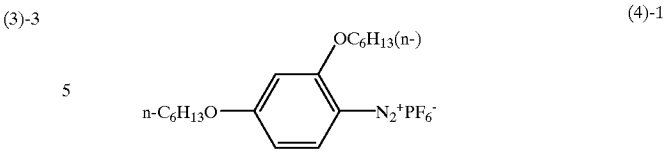

In the present invention, the diazonium salt compounds represented by the constitutional formulae (2), (3), and (4) may be used singly or may be used in combination of two or more. Further, the diazonium salt compounds represented by the constitutional formulae (2), (3), and (4) may also be used together with known diazonium salt compounds in accordance with various purposes such as control of hue, and the like.

As a coupler which forms a dye by coupling with the above-described diazonium salt compound in the present invention, any compound can be used so long as it forms a dye by coupling with the diazonium salt compound in a basic atmosphere and/or a neutral atmosphere. In the present invention, so-called 4-equivalent couplers used as a silver halide photographic light-sensitive material can be used as the coupler, and can be selected according to an intended hue. For example, so-called active methylene compounds having a methylene group adjacent to a carbonyl group, phenol derivatives, naphthol derivatives, and the like can be used, and specific examples thereof include the following compounds and these compounds are used in a range which complies with the object of the present invention.

A particularly preferable coupler which can be used in the present invention is a compound represented by the following formula.

$$E^1-CH_2-E^2$$

The coupler represented by the above-described formula will be hereinafter described in detail. In the above-described formula, electron attractive groups represented by $E^1$ and $E^2$ each indicate a substituent having a positive Hammett σ value, and they may be the same or different from each other. An acyl group, an alkoxycarbonyl group, a carbamoyl group, a cyano group, a nitro group, an alkylsulfonyl group, an arylsulfonyl group, a heterocyclic group, a phosphono group, and the like are preferably used. Further, acyl groups such as an acetyl group, a propionyl group, a pivaloyl group, a chloroacetyl group, a trichloroacetyl group, a trifluoroacetyl group, 1-methylcyclopropylcarbonyl group, 1-ethylcyclopropylcarbonyl group, 1-benzylcyclopropylcarbonyl group, a benzoyl group, 4-methoxybenzoyl group, and a thenoyl group; oxycarbonyl groups such as a methoxycarbonyl group, ethoxycarbonyl group, 2-methoxyethoxycarbonyl group, and 4-methoxyphenoxycarbonyl group; carbamoyl groups such as a carbamoyl group, N,N-diemthylcarbamoyl group, N,N-diethylcarb amoyl group, N-phenylcarbamoyl group, N-[2,4-bis(pentyloxy)phenyl]carbamoyl group, N-[2,4-bis(octyloxy)phenyl]carbamoyl group, and morpholinocarbonyl group; alkylsulfonyl groups or arylsulfonyl groups such as a methanesulfonyl group, a benzenesulfonyl group, and a toluenesulfonyl group; phosphono groups such as a diethylphosphono group; heterocyclic groups such as a benzooxazole-2-yl group, benzothiazole-2-yl group, 3,4-dihydroquinazoline-4-on-2-yl group, and 3,4-dihydroquinazoline- 4-sulfone-2-yl group; a nitro group; an imino group; and a cyano group.

The electron attractive groups represented by $E^1$ and $E^2$ may be boded to form a ring. As the ring formed of $E^1$ and $E^2$, a 5 to 6-membered carbon ring or hetero ring is preferable. Specific examples thereof include resorcin, phloroglucine, 2,3-dihydroxynaphthalene, sodium 2,3-dihydroxynaphthalene-6-sulfonate, N-3-morpholinopropyl-1-hydroxy-2-naphthalenesulfonamide, sodium 2-hydroxy-3-naphthalenesolfonate, 2-hydroxy-3-naphthalenesulfonanilide, N-3-morpholinopropyl-2-hydroxy-3-naphthalenesulfonamide, N-3-(2-ethylhexyl)propyl-2-hydroxy-3-naphthalenesulfonamide, N-2-ethylhexyl-2-hydroxy-3-naphthalenesulfonamide, 5-acetamide-1-naphthol, sodium 1-hydroxy-8-acetamidonaphthalene-3,6-disulfonate, 1-hydroxy-8-acetamidonaphthalene-3,6-dissulfonanilide, 1,5-dihydroxynaphthalene, N-3-morpholinopropyl-2-hydroxy-3-naphthamide, N-octyl-2-hydroxy-3-naphthamide, 2-hydroxy-3-naphthanilide, 5,5-dimethyl-1,3-cyclohexanedione, 1,3-cyclopentanadione, 5-(2-n-tetradecyloxyphenyl)-1, 3-cyclohexanedione, 5-phenyl-4-methoxycarbonyl-1,3-cyclohexanedione, 5-(2, 5-di-n-octyloxyphenyl)-1,3-cyclohexanedione, N,N'-dicyclohexylbarbituric acid, N,N'-di-n-dodecylbarbituric acid, N-n-octyl-N'-n-octadecylbarbituric acid, N-phenyl-N'-(2,5-di-n-octyloxyphenyl)barbituric acid, N,N'-bis(octadecyloxycarbonylmethyl)barbituric acid, 1-phenyl-3-methyl-5-pyrazolone, 1-(2,4,6-trichlorophenyl)-3-anilino-5-pyrazolone, 1-(2,4,6-trichlorophenyl)-3-benzamide-5-pyrazolone, 6-hydroxy-4-methyl-3-cyano-1-(2-ethylhexyl)-2-pyridone, 2,4-bis-(benzoylacetamide)toluene, 1,3-bis-(pivaloylacetamidemethyl)benzene, benzoylacetnitrile, thenoylacetnitrile, acetacetanilide, benzoylacetanilide, pivaloylacetanilide, 2-chloro-5-(N-n-butylsulfamoyl)-1-pivaloylacetamidebenzene, 1-(2-ethylhexyloxypropyl)-3-cyano-4-methyl-6-hydroxy-1,2-dihydropyridine-2-one, 1-(dodecyloxypropyl)-3-acetyl-4-methyl-6-hydroxy-1,2-dihydropyridine-2-one, 1-(4-n-octyloxyphenyl)-3-tert-butyl-5-aminopyrazole and the like.

The details of the coupler are described in Japanese Patent Application Laid-Open (JP-A) Nos. 4-201483, 7-223367, 7-223368, 7-323660, Japanese Patent Application Nos. 5-278608, 5-297024, 6-18669, 6-18670, 7-316280, 8-027095, 8-027096, 8-030799, 8-12610, 8-132394, 8-358755, 8-358756, 9-069990, and the like.

Specific examples of the coupler represented by the above-described formula of the present invention include the following compounds, but are not limited to the same.

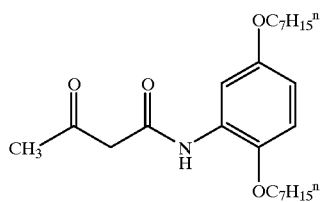
B-1

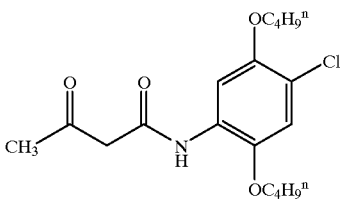
B-2

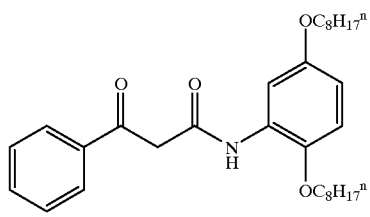
B-3

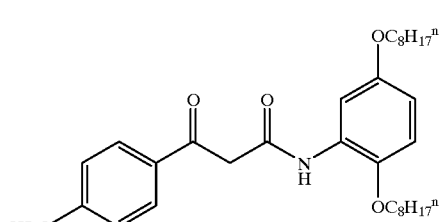
B-4

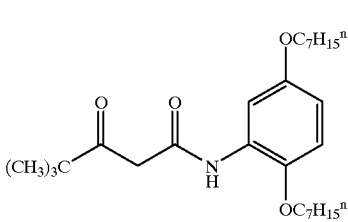
B-5

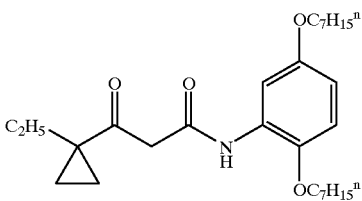
B-6

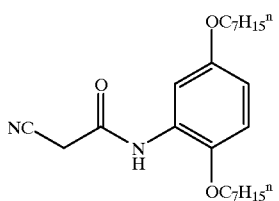
B-7

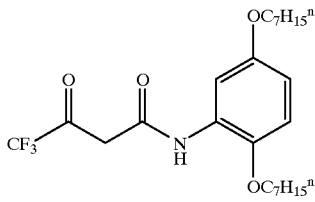
B-8

B-9
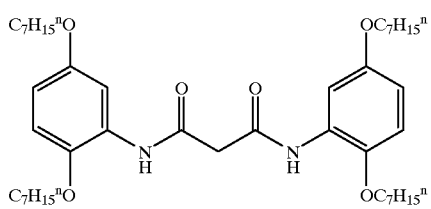
B-10
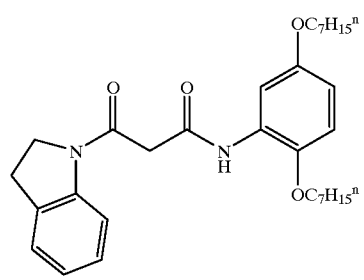
B-11
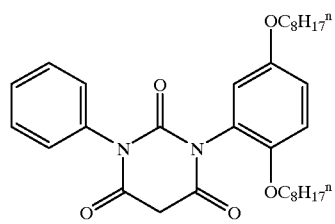
B-12
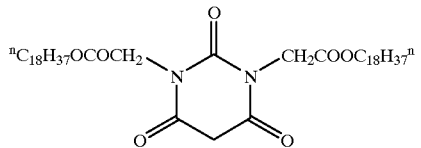
B-13
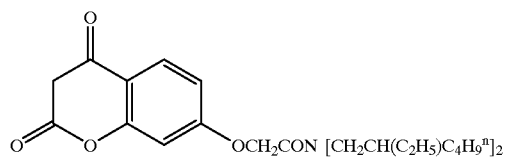
B-14
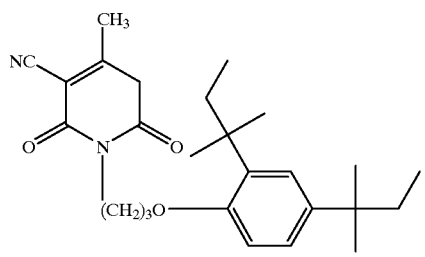
B-15
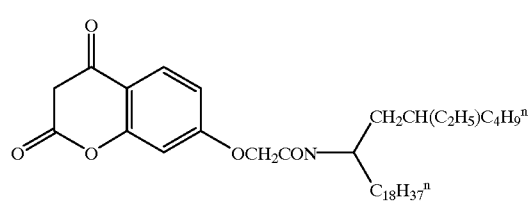
B-16
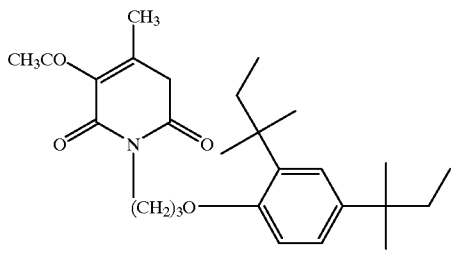
B-17
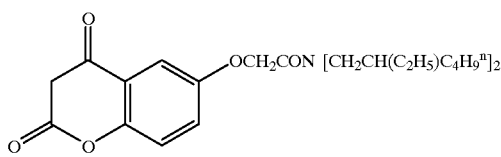
B-18
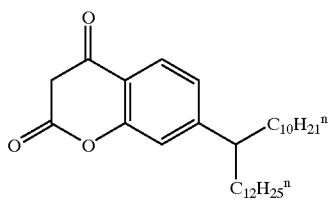
B-19
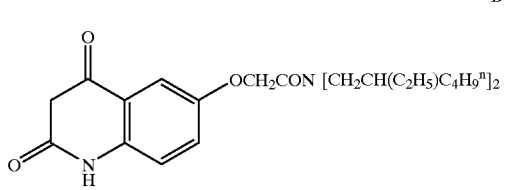
B-20
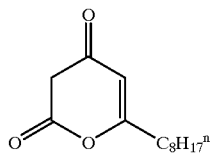
B-21
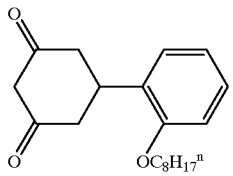
B-22
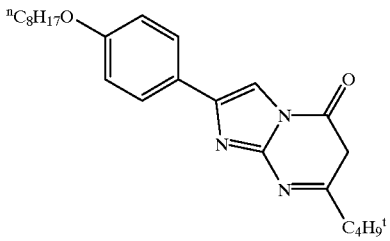

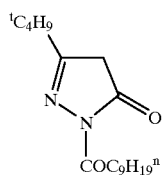
B-23

B-24

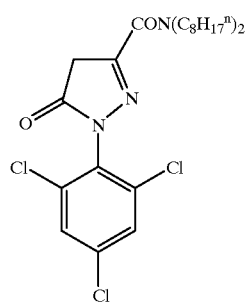
B-25

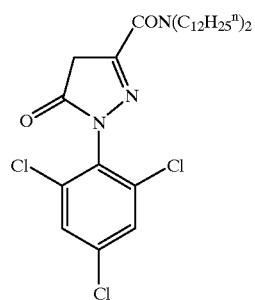
B-26

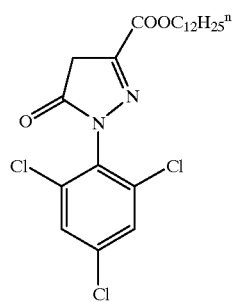
B-27

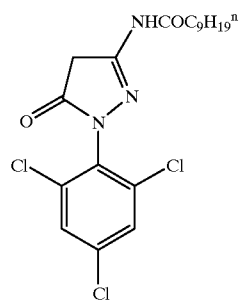
B-28

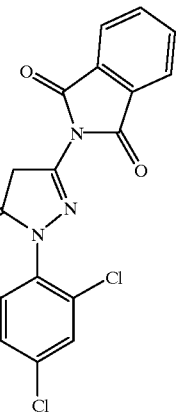
B-29

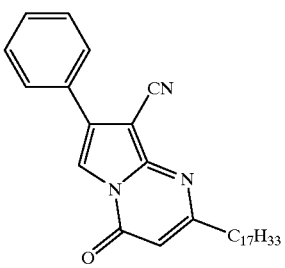
B-30

In the light-sensitive and heat-sensitive recording material of the present invention, in addition to the above-described diazonium salt compounds and couplers, a combination of an electron-donating dye precursor and an electron-receiving compound, that is, a leuco-based color forming agent, can be used as a color forming element. Namely, a light-sensitive and heat-sensitive recording material comprised of plural light-sensitive recording layers can be formed in such a manner that at least one of the recording layers includes a leuco-based color forming agent.

Examples of the electron-donating dye precursor include triarylmethane-based compound, diphenylmethane-based compound, thiazine-based compound, xanthene-based compound, and spiropyran-based compound. Among these compounds, triarylmethane-based compound and xanthene-based compound are particularly useful from the viewpoint of high density of formed color. Some examples thereof include 3,3-bis(p-dimethylaminophenyl)-6-dimethylaminophthalide (that is, Crystal Violet lactone), 3,3-bis-(p-dimethylamino)phthalide, 3-(p-dimethylaminophenyl)-3-(1,3-dimethylindole-3-yl)phthalide, 3-(p-dimethylaminophenyl)-3-(2-methylindole-3-yl)phthalide, 3-(o-methyl-p-diethylaminophenyl)-3-(2-methylindole-3-yl)phthalide, 4,4'-bis(dimethylamino)benzhydrinbenzylether, N-halophenyl leuco auramine, N-2,4,5-trichlorophenyl leuco auramine, rhodamine-B-anilinolactam, rhodamine(p-nitroanilino)lactam, rhodamine-B-(p-chloroanilino)lactam, 2-benzylamino-6-diethylaminofluoran, 2-anilino-6-diethylaminofluoran, 2-anilino-3-methyl-6-diethylaminofluoran, 2-anilino-3-methyl-6-cyclohexylmethylaminofluoran, 2-anilino-3-methyl-6-isoamylethylaminofluoran, 2-(o-chloroanilino)-6-diethylaminofluoran, 2-octylamino-6-diethylaminofluoran, 2-ethoxyethylamino-3-chloro-2-diethylaminofluoran, 2-anilino-3-chloro-6-diethylaminofluoran, benzoyl leuco methylene blue, p-nitrobenzyl leuco methylene blue, 3-methyl-spiro-dinaphthopirane, 3-ethyl-spirodinaphthopyran, 3,3'-dichloro-spiro-dinaphthopyran, 3-benzylspirodinaphthopyran, and 3-propyl-spiro-dibenzopyran.

Examples of the electron-receiving compound include phenol derivatives, salicylic acid derivatives, hydroxybenzoate ester, and the like. Among these, bisphenols and hydroxybenzoate esters are particularly preferable. Some examples thereof include 2,2-bis(p-hydroxyphenyl)propane (that is, bisphenol A), 4,4'-(p-phenylenediisopropylidene) diphenol (that is, bisphenol P), 2,2'-bis(p-hydroxyphenyl) pentane, 2,2-bis(p-hydroxyphenyl) ethane, 2,2-bis(p-hydroxyphenyl)butane, 2,2-bis(4'-hydroxy-3',5'-dichlorophenyl)propane, 1,1-(p-hydroxyphenyl) cyclohexane, 1,1-(p-hydroxyphenyl)propane, 1,1-(p-hydroxyphenyl)pentane, 1,1-(p-hydroxyphenyl)-2-ethylhexane, 3,5-di-(α-methylbenzyl) salicylic acid and polyvalent metallic salts thereof, 3,5-di(tert-butyl)salicylic acid and polyvalent metallic salts thereof, 3-α,α-dimethylbenzyl salicylic acid and polyvalent metallic salts thereof, p-hydroxybutyl benzoate, p-hydroxybenzyl benzoate, p-hydroxy benzoate-2-ethylhexyl, p-phenylphenol, p-cumylphenol, and the like.

The light-sensitive and heat-sensitive recording material of the present invention may contain a sensitizer. As the sensitizer, low-melting-point organic compounds having an aromatic group and a polar group being appropriately contained in a molecule thereof is preferably used. Examples of the compound include p-benzyloxybenzyl benzoate, α-naphthylbenzylether, β-naphthylbenzylether, β-phenylester naphthoic acid, α-hydroxy-β-phenylester naphthoic acid, β-naphthol-(p-chlorobenzyl)ether, 1,4-butanediolphenylether, 1,4-butanediol-p-methylphenylether, 1,4-butandiol-p-ethylphenylether, 1,4-butandiol-m-methylphenylether, 1-phenoxy-2-(p-triloxy) ethane, 1-phenoxy-2-(p-ethylphenoxy)ethane, 1-phenoxy-2-(p-chlorophenoxy) ethane, p-benzylbiphenyl, and the like.

In the present invention, the form in which each of the diazonium salt compound, coupler which forms color by reacting with the diazonium salt compound due to heating, basic material, electron-donating colorless dye, electron-receiving compound, sensitizer, and the like is used is not particularly limited. In other words, there are listed the following methods: (1) a method of using them in a solid-dispersion state; (2) a method of using them in a state of being emulsified and dispersed; (3) a method of using them in a polymer-dispersion state; (4) a method of using them in a latex-dispersion state; and (5) a method of using them in a state of being enclosed in micro-capsules. Among these methods, the method of using them enclosed in micro-capsules is particularly preferable from the standpoint of storability. In a color formation system in which reaction between the diazonium salt compound and the coupler is utilized, a method of using the diazonium salt compound enclosed in micro-capsules is preferable. Further, in a color formation system in which reaction between the electron-donating colorless dye and the electron-receiving compound is utilized, a method of using the electron-donating colorless dye enclosed in micro-capsules is also preferable.

As the method for forming a micro capsule, a conventionally known method for forming a micro capsule can be used. For instance, a micro capsule can be formed by dissolving a coloration agent, additives, and a micro-capsule wall precursor in an organic solvent having resistance to solubility, or insoluble, in water, adding the resulting solution to an aqueous solution of a water-soluble high polymer, emulsifying and dispersing the mixture using a homogenizer, and increasing the temperature to thereby allow high polymers serving as a micro-capsule wall to form a wall film at an oil/water interface.

Examples of the above-described organic solvent include low-boiling-point auxiliary solvents such as acetate, methylene chloride, and cyclohexanone, and/or phosphate, ester phthalate, ester acrylate, ester methacrylate, other esters of carboxylate, fatty acid amide, alkylated biphenyl, alkylated tarphenyl, alkylated naphthalene, diarylethane, chlorinated paraffin, alcohols, phenols, ethers, monoolefins, and epoxy. Specific examples thereof include high-boiling-point oil such as tricresyl phosphate, trioctyl phosphate, octyldiphenyl phosphate, tricyclohexyl phosphate, dibutyl phthalate, dioctyl phthalate, dilaurate phthalate, dicyclohexyl phthalate, butyl olefinic acid, diethyleneglycol benzoate, dioctyl sebacate, dibutyl sebacate, adipic acid dioctyl, trimellitic acid trioctyl, acetyltriethyl citrate, octyl maleate, dibutyl maleate, isoamyl biphenyl, chlorinated paraffin, diisopropylnaphthalene, 1,1'-ditrylethane, 2,4-ditertiallyamylphenol, N,N-dibutyl-2-butoxy-5-tertiallyoctylaniline, hydroxy benzoate 2-ethylhexylester, and polyethylene glycol. Among these, alcohols, ester phosphates, carboxylic acid-based esters, alkylated biphenyl, alkylated tarphenyl, alkylated naphthalene, and diarylethane are particularly preferable. Further, a carbonization inhibitor such as hindered phenol or hindered amine may also be added to the above-described high-boiling-point oil.

Specific examples of high polymers serving as a wall film of the micro-capsule include polyurethane resin, polyurea resin, polyamide resin, polyester resin, polycarbonate resin, aminoaldehyde resin, melamine resin, polystyrene resin, stylene-acrylate copolymer resin, styrene-methacrylate copolymer resin, gelatin, polyvinyl alcohol, and the like. Among these, as a particularly preferable wall material, polyurethane/polyurea resin is used.

A micro capsule having a wall film comprised of the above-described polyurethane/polyurea resin is manufactured in such a manner that a micro-capsule wall precursor such as polyisocyanate is mixed with a core material to be formed as a capsule and the mixture is emulsified and dispersed in an aqueous solution of a high water-soluble polymer, such as polyvinyl alcohol, and the liquid temperature is increased to thereby cause reaction for formation of high polymers at oil drop interfaces.

Some specific examples of the polyisocyanate compound are shown below. For example, diisocyanates such as m-phenylenediisocyanate, p-phenylenediisocyanate, 2,6-tolylenediisocyanate, 2,4-tolylenediisocyanate, naphthalene-1,4-diisocyanate, diphenylmethane-4,4'-diisocyanate, 3,3'-diphenylmethane-4,4'-diisocyanate, xylene-1,4-diisocyanate, 4,4'-diphenylpropanediisocyanate, trimethylenediisocyanate, hexamethylenediisocyanate, propylene-1,2-diisocyanate, butylene-1,2-diisocyanate, cyclohexylene-1,2-diisocyanate, and cyclohexylene-1,4-diisocyanate; triisocyanates such as 4,4',4"-triphenylmethanetriisocyanate, and toluene-2,4,6-triisocyanate; tetraisocyanates such as 4,4'-dimethylphenylmethane-2,2',5,5'-tetraisocyanate; and isocyanate polymers such as an adduct of hexamethylenediisocyanate and trimethylolpropane, an adduct of 2,4-tolylenediisocyanate and trimethylolpropane, an adduct of xylylenediisocyanate and trimethylolpropane, and an adduct of tolylenediisocyanate and hexanetriol. These compounds may be used singly or may be used in combination of two or more. Among these, a compound having three or more isocyanate groups in a molecule thereof is particularly preferable.

In the above-described method for forming a micro-capsule, as an organic solvent in which the coloration agent, additives, and micro-capsule wall precursor are dissolved, oil indicated in the emulsification/dispersion process can be used. The same applies to the high water-soluble polymer.

As the above-described oil, oil having unsaturated fatty acid is particularly preferable. For example, α-methylstyrene dimer and the like can be used. One example of the α-methylstyrene dimer is "MSD100" (trade name) manufactured by Mitsui Toatsu Chemicals, Inc.

Examples of the above-described high water-soluble polymer include polyvinyl alcohol and the like. An emulsion of hydrophobic polymer, or a latex can also be used together.

Examples of the high water-soluble polymer include polyvinyl alcohol, silanol-modified polyvinyl alcohol, carboxy-modified polyvinyl alcohol, amino-modified polyvinyl alcohol, itaconic acid-modified polyvinyl alcohol, styrene-maleic anhydride copolymer, butadiene-maleic anhydride copolymer, ethyrene-maleic anhydride copolymer, isobutylene-maleic anhydride copolymer, polyacrylamide, sulfonate polystyrene, polyvinyl pyrrolidone, ethyrene-acrylic acid copolymer, gelatin, and the like. Among these, carboxy-modified polyvinyl alcohol is particularly preferable.

Examples of the emulsion of hydrophobic polymers, or the latex include styrene-butadiene copolymer, carboxy-modified styrene-butadiene copolymer, acrylonitrile-butadiene copolymer, and the like. In this case, conventionally known surfactants may be added if necessary.

The grain size of the micro capsule is preferably in the range from 0.1 to 1.0 μm, more preferably in the range from 0.2 to 0.7 μm.

When the light-sensitive and heat-sensitive recording material of the present invention is used as a heat development-type recording material, if necessary, a basic material which functions as coloring auxiliaries is preferably added so as to facilitate coupling reaction. Examples of basic material include a basic material having resistance to solubility in, to be soluble in water, or insoluble in water, a material which generates alkaline substances due to heating, and the like.

Specific examples of the basic material include inorganic and organic ammonium salts, organic amine, amide, urea or thiourea, and derivatives thereof, and nitrogen-containing compounds such as thiazoles, pyrroles, pyrimidines, piperazines, guanidines, indoles, imidazoles, imidazolines, triazoles, morpholines, piperidines, amidines, formamidines, and pyridines. These basic materials may be used in combination of two or more.

In order to allow rapid and complete heat development with low energy, phenol derivative, naphthol derivative, alkoxy-substituted benzenes, alkoxy-substituted naphthalenes, hydroxy compound, acid compound, and sulfonamide compound can be further added to the light-sensitive and heat-sensitive recording layer. These compounds are used to decrease the melting point of the coupling component or of a basic material or to improve thermopenetration of a micro-capsule wall. As a result, these compounds function as coloring auxiliaries to thereby obtain high density of color that is formed. Heat-fusible materials can also be used as other coloring auxiliaries. The heat-fusible materials mentioned herein are those whose melting point is in the range from 50 to 150° C., which materials are in a solid state at ordinary temperatures and are molten by heating. These materials allow the diazo compound, coupling component, or basic material to melt. Specific examples of the above-described heat-fusible materials include fatty acid amide, N-substituted fatty acid amide, ketone compound, urea compound, esters, and the like.

The above-described basic material and coloring auxiliaries are preferably added at the time of preparation of a coupler dispersing liquid.

The light-sensitive and heat-sensitive recording material of the present invention may include one or plural heat-sensitive recording layers. When plural heat-sensitive recording layers are provided, it is necessary to use color forming agents having different requirements energy for forming colors.

Further, the light-sensitive and heat-sensitive recording material of the present invention may be of full-color type or a monochrome type, but it preferably has a diazonium salt compound and at least one heat-sensitive recording layer (light fixation-type heat-sensitive recording layer) on a substrate, which heat-sensitive recording layer includes, as principal components, a binder and a diazo-based coloring agent containing a coupler which reacts with the diazonium salt compound. For example, the light fixation-type heat-sensitive recording layer including: a diazonium salt compound whose maximum absorption wavelength is 360±20 nm; a heat-sensitive recording layer containing a coupler which forms a color by reacting with the diazonium salt compound; a diazonium salt compound whose maximum absorption wavelength is 410±20 nm; and a light fixation-type heat-sensitive recording layer containing a coupler which forms a color by reacting with the diazonium salt compound is preferable.

When a heat-sensitive recording layer of full color type (including cyan, yellow, and magenta) is used, preferably, three layers are all formed by diazo-based color forming agents, or a first heat-sensitive recording layer provided directly on a substrate is formed by a leuco-based color forming agent containing an electron-donating dye and an electron-receiving compound, and second and third heat-sensitive recording layers are formed by diazo-based color forming agents.

When the three heat-sensitive recording layers are all formed by diazo-based color forming agents, the heat-sensitive recording layers are preferably structured such that a first light fixation-type heat-sensitive recording layer which contains a diazonium salt compound whose maximum absorption wavelength is 340±20 nm or less and a coupler forming a color by reacting with the diazonium salt compound, a second light fixation-type heat-sensitive recording layer which contains a diazonium salt compound whose maximum absorption wavelength is 360±20 nm and a coupler forming a color by reacting with the diazonium salt compound, and a third light fixation-type heat-sensitive recording layer which contains a diazonium salt compound whose maximum absorption wavelength is 400±20 nm and a coupler forming a color by reacting with the diazonium salt compound are provided on a substrate in that order.

Further, when a leuco-based color forming agent is used for the first layer, for example, a first heat-sensitive recording layer containing an electron-donating dye and an electron-receiving compound, a second light fixation-type heat-sensitive recording layer containing a diazonium salt compound whose maximum absorption wavelength is 360±20 nm and a coupler forming a color by reacting with the diazonium salt compound, and a third light fixation-type heat-sensitive layer containing a diazonium salt compound whose maximum absorption wavelength is 410±20 nm and a coupler forming a color by reacting with the diazonium salt compound are preferably provided on a substrate in that order.

The heat-sensitive recording layer of the present invention is preferably formed with a light transmittance adjusting layer and a protective layer, which will be described later, being provided on the above-described heat-sensitive recording layer.

In a method of recording using a light-sensitive and heat-sensitive recording material containing the above-described plural heat-sensitive recording layers formed by diazo-based color forming agents, first, the third heat-sensitive recording layer is heated and the diazonium salt compound and the coupler which are contained in the third layer are reacted with each other so as to form color, and thereafter, light of the maximum absorption wavelength of the diazonium salt compound for the third layer irradiated on the third layer to thereby cause decomposition of unreacted diazonium salt compound contained in the third layer. Next, heat sufficient for forming color of the second heat-sensitive recording layer is applied to the second layer to thereby allow the diazonium salt compound and the coupler, which are contained in the second layer, to form color. At this time, although the third heat-sensitive recording layer is simultaneously heated significantly, the diazonium salt compound in the third layer has already decomposed and the color forming ability is lost. Therefore, the diazonium salt compound in the third layer does not form color. Subsequently, light of the maximum absorption wavelength of the diazonium salt compound for the second layer irradiated on the second layer and the diazonium salt compound contained in the second layer is decomposed and fixed. Finally, heat sufficient for forming color of the first heat-sensitive recording layer is applied to the first layer and the first layer is thereby colored. At this time, although the third and second heat-sensitive recording layers are simultaneously heated significantly, the diazonium salt compounds contained in the third and second layers have already decomposed and the color forming abilities thereof are lost. Accordingly, no color is formed in the third and second layers. A fixing process for the diazonium salt compound in the third layer may be omitted.

Further, in a case in which the third layer is comprised of a leuco-based color forming agent as well, the other two heat-sensitive recording layers containing diazo-based color forming agents are colored. and fixed in the same manner as described above, and the layer containing a leuco-based color forming agent is finally heated so as to form a color.

Light transmittance adjusting layer

The light transmittance adjusting layer contains a component which functions as a precursor of an ultraviolet ray absorbent, and prior to irradiation with light in a wavelength region required for fixing, it does not function as the ultraviolet ray absorbent, and therefore, the layer has a high light transmittance. When the light fixation-type heat-sensitive recording layer is fixed, the layer allows light in a wavelength region required for fixing to be sufficiently transmitted therethrough. Further, the layer has a high transmittance for visible light and there is usually no difficulty in fixing on the heat-sensitive recording layer. The precursor of the ultraviolet ray absorbent is preferably contained in a micro-capsule. In the present invention, as a compound contained in the light transmittance adjusting layer, compounds disclosed in JP-A No. 9-1928 can be used.

After completion of irradiation with light in a wavelength region required for fixing on the light fixation-type heat-sensitive recording layer using irradiation with light, the precursor of the ultraviolet ray absorbent reacts due to light or heat so as to function as the ultraviolet ray absorbent, and the majority part of the light in the wavelength region of the ultraviolet rays required for the fixing, is absorbed by the ultraviolet ray absorbent and the light transmittance decreases, and light resistance of the heat-sensitive recording layer improves. However, the light transmittance adjusting layer does not significantly affect visible light absorption, and therefore, the transmittance of visible light does not substantially change.

At least one light transmittance adjusting layer can be provided in the light fixation-type light-sensitive and heat-sensitive recording material, and it is most preferable that it be provided between the light fixation-type heat-sensitive recording layer and an outermost protective layer. Further, the light transmittance adjusting layer may also be used as a protective layer. Characteristics of the light transmittance adjusting layer can be arbitrarily selected in accordance with characteristics of the light fixation-type heat-sensitive recording layer.

Protective layer

The protective layer may contain, together with binder, pigment, lubricant, surfactant, dispersing agent, fluorescent whitening agent, metallic soap, hardener, ultraviolet ray absorbent, cross linking agent, and the like.

Examples of the binder include polyvinyl alcohol, methyl cellulose, carboxymethyl cellulose, hydroxyethyl cellulose, starches, gelatin, gum arabic, casein, styrene-maleic anhydrate copolymer hydrolysate, ethylene-maleic anhydrate copolymer hydrolysate, isobutylene-maleic anhydrate copolymer hydrolysate, polyvinyl alcohol, modified polyvinyl alcohol, and polyacrylamide. These can be selected appropriately in a scope in which barrier efficiency and operating efficiency are maintainable.

Other examples of the binder include synthetic rubber latex or synthetic resin emulsion, and specific examples thereof include styrene-butadiene rubber latex, acrylonitrile-butadiene rubber latex, methyl acrylate-butadiene rubber latex, and vinyl acetate emulsion.

An amount of the binder used is in the range from 10 to 500% by weight, preferably in the range from 50 to 400% by weight, based on the total weight of the pigments contained in the protective layer.

Further, in order to further improve water resistance, it is effective to use a cross linking agent and a catalyst which facilitates reaction of the cross linking agent. Specific examples of the cross linking agent include epoxy compounds, blocked isocyanate, vinylsulfone compound, aldehyde compounds, methylol compounds, boric acid, carboxylic acid anhydrate, silane compounds, chelate compounds, and halides. Compounds which can adjust pH of a coating liquid at a value of 6.0 to 7.5 is preferable. As the catalyst, known materials such as acid and metallic salt can be used, and a material which can adjust pH of a coating liquid at a value of 6.0 to 7.5 is preferable.

Pigments which can be used for the protective layer of the present invention include generally known organic or inorganic pigments. Specific examples thereof include calcium carbonate, aluminium hydroxide, barium sulfate, titanium oxide, talc, agalmatolite, kaolin, baked kaolin, amorphous silica, urea-formalin resin particles, polyethylene resin particles, benzo guanamine resin particles, and the like. These compounds may be used singly or may be used in combination of two or more.

Suitable examples of the lubricant include zinc stearate, calcium stearate, paraffin wax, polyethlene wax, and the like.

Suitable examples of the surfactant include sulfo-succinic acid-based alkali metallic salt, fluorine-containing surfactant, and the like, in order that the protective layer be uniformly formed on the heat-sensitive recording layer. Specific examples thereof include ammonium salt and sodium salt such as di-(2-ethylhexyl) sulfo-succinic acid, di-(n-hexyl) sulfo-succinic acid, and the like.

A protective layer coating liquid of the present invention is obtained by mixing the above-described components. If necessary, a mold releasing agent, wax, or water repellent agent may also be added. The obtained protective layer coating liquid is applied onto the heat-sensitive coloring layer by using a coating device such as a bar coater, an air knife coater, a blade coater, a curtain coater, or the like, and dried. As a result, a protective layer can be formed. The protective layer may be applied together with the color forming layer. Alternatively, after coating and drying the heat-sensitive coloring layer, the protective layer may be applied onto the dried heat-sensitive coloring layer.

The amount of the protective layer coated and dried is preferably in the range from 0.2 to 7 g/m², more preferably in the range from 1 to 4 g/m².

If the amount of the protective layer coated and dried is too large, heat sensitivity thereof remarkably decreases. Further, if it is too small, water resistance cannot be maintained. After coating of the above-described protective layer coating liquid, calender processing may be conducted if necessary.

Intermediate layer

When plural heat-sensitive recording layers are provided, intermediate layers are preferably provided between the heat-sensitive recording layers. The intermediate layers may each contain pigments, lubricants, surfactants, dispersing agents, fluorescent whitening agents, metallic soaps, ultra-violet ray absorbents, and the like in addition to various binders, in the same manner as in the above-described protective layer. As the binder used herein, the same binders as those used for the protective layer can be used.

Substrate

In the light-sensitive and heat-sensitive recording material of the present invention, examples of the substrate include polyethylene terephthalate (PET), polyethylene naphthalate (PEN), triacetylcellulose (TAC), paper, plastic film laminated paper, synthetic paper, and the like. Further, in order to obtain a transparent light-sensitive and heat-sensitive recording material, it is necessary to use a transparent substrate.

Examples of the transparent substrate include synthetic polymer films, for example, a polyester film such as polyethylene terephthalate or polybutylene terephthalate, a cellulose triacetate film, and a polyolefin film such as polypropylene or polyethylene. These compounds may be used singly, or two or more of them may be used laminated together. The thickness of the synthetic polymer film is preferably in the range from 25 to 250 μm, more preferably in the range from 50 to 200 μm.

The above-described synthetic polymer film may be colored an arbitrary hue. The following methods may be used to form color on the polymer film. For example, a method in which a film is formed after a dye is kneaded with a resin; a known coating method in which a coating liquid with a dye dissolved in a suitable solvent is prepared and applied onto a transparent colorless resin film; a coating/drying method using gravure coating, roller coating, or wire coating; and the like. Among these methods, it is preferable to use a method in which polyester resin such as polyethylene terephthalate or polyethylene naphthalate with which blue dye is kneaded is formed as a film and the obtained film is subjected to heat resistance treatment, drawing processing, and antistatic treatment.

The above-described heat-sensitive recording layer, protective layer, intermediate layer, light-reflection preventing layer, light cut-off layer, undercoat layer, and back-coating layer can each be formed in such a manner as to be applied onto a substrate by a known coating method such as blade coating, air knife coating, gravure coating, roll coating, spray coating, dip coating, bar coating, or the like.

EXAMPLES

The present invention will further be described in detail with reference to the following examples, but it is not limited to the same. In the examples given below, all "parts" indicate "parts by weight".

Example 1

(1) Preparation of coating liquid for heat-sensitive recording layer Preparation of micro-capsule liquid A Into 16.4 parts of ethyl acetate were dissolved 2.2 parts of the following compound (A-1) having the maximum absorption wavelength of 420 nm and 2.2 parts of the following compound (A-2), which compounds are diazonium compounds. To this mixture were added 7.3 parts of isopropylbiphenyl, which is a high-boiling-point solvent, 2.5 parts of tricresyl phosphate, and 0.4 parts of acylphosphine oxide compound (19), and they were heated and mixed uniformly.

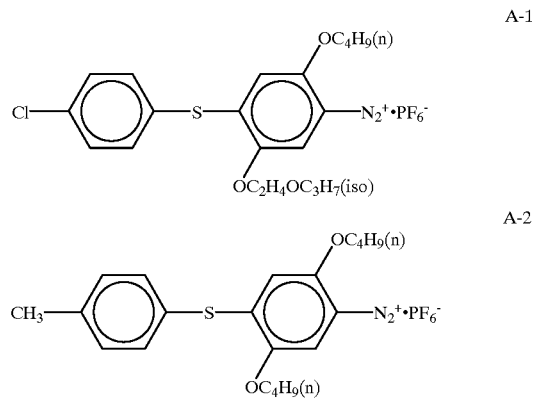

Then, to the above-described mixture were added 4.5 parts of xylylenediisocyanate/trimethylolpropane adduct (Takenate D110N, 75% by weight solution of ethyl acetate, manufactured by Takeda Chemical Industries Ltd.), which is a capsule wall agent, and 4.5 parts of a 30% by weight solution of ethyl acetate of xylylenediisocyanate/bisphenol A adduct synthesized in accordance with a description given by Japanese Patent Application No. 5-233536, and they were stirred uniformly.

77 parts of a 6% by weight aqueous solution of gelatin with 0.96 parts of Scraph A G-8 (manufactured by Nippon Fine Chemical Co., Ltd.) added thereto was separately prepared, and to this solution was added the above-described mixed solution of diazonium compound (solution), and they were emulsified and dispersed by using a homogenizer. To the resultant emulsified liquid was added 20 parts of water, and they were made uniform, and thereafter, a micro-capsule forming reaction was conducted for 3 hours at a temperature of 40° C. while stirring. Subsequently, the temperature was cooled down to 35° C., and to the above-described mixture were added 6.5 parts of ion exchange resin amberlite IRA68 (manufactured by Organo Corp.) and 13 parts of amberlite IRC50 (manufactured by Organo Corp.), and they were stirred for 1 hour. After filtration of the ion exchange resin, to 10 parts of capsule liquid was added 0.4 parts of 1% by weight aqueous solution of hydroquinone, and they were stirred. As a result, capsule liquid A of diazonium compound was obtained. The average grain size of the capsule was 0.8 μm.

Preparation of coupler emulsified liquid

Into 10.5 parts of ethyl acetate were dissolved 3.0 parts of a coupler represented by the following formula, 3.0 parts of triphenylguanidine, 0.5 parts of tricresyl phosphate, and 0.24 parts of diethyl maleate, to obtain a II liquid.

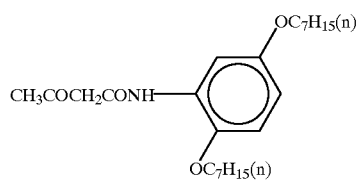

Next, 49 parts of a 15% by weight aqueous solution of lime-treated gelatin, 9.5 parts of a 10% aqueous solution of sodium docecylbenzenesulfonate, and 35 parts of water were mixed uniformly at the temperature of 40° C., and the II liquid was added to the mixture. The resultant mixture was emulsified and dispersed for 10 minutes at 40° C. and 10000 r.p.m. using a homogenizer. The obtained emulsified liquid was stirred for 2 hours at 40° C. to remove ethyl acetate. Thereafter, the amount of ethyl acetate and water, that evaporated, was compensated for by addition of water, and a coupler emulsified liquid was thus obtained.

Preparation of coating liquid for heat-sensitive recording layer 3.6 parts of each of micro-capsule liquid A, micro-capsule liquid B, and micro-capsule liquid C, 10 parts of water, and 15 parts of coupler emulsified liquid B were mixed uniformly, to obtain a coating liquid for a heat-sensitive recording layer.

(2) Preparation of coating liquid for a protective layer 100 parts of a 6% aqueous solution of itaconic acid-modifed polyvinyl alcohol (trade name: KL-318, manufactured by Kuraray Co., Ltd.) and 10 parts of a 30% dispersion of epoxy-modified polyamide (trade name: FL-71, manufactured by Toho Chemical Industry Co., Ltd.) were mixed together, and to the mixture was mixed uniformly 15 parts of a 40% dispersion of zinc stearate (trade name: Hydrin Z, manufactured by Chukyo Yushi K.K.) to obtain a protective layer coating liquid.

(3) Preparation of light-sensitive and heat-sensitive recording material

The coating liquid for a heat-sensitive recording layer, and the protective layer coating liquid were applied in that order by a wire bar onto a substrate for a photographic printing paper formed by laminating polyethylene on high quality paper, and dried at a temperature of 50° C., to obtain a material intended for heat sensitive recording. The amounts applied in terms of solid component were 15.0 g/m$^2$ and 1.2 g/m$^2$, respectively.

Example 2

A light-sensitive and heat-sensitive recording material was prepared in the same manner as in Example 1 except that the acylphosphine oxide compound (19) was changed to an acylphosphine oxide compound (2).

Example 3

A light-sensitive and heat-sensitive recording material was prepared in the same manner as in Example 1 except that the acylphosphine oxide compound (19) was changed to an acylphosphine oxide compound (4).

Example 4

A light-sensitive and heat-sensitive recording material was prepared in the same manner as in Example 1 except that the acylphosphine oxide compound (19) was changed to an acylphosphine oxide compound (22).

Example 5

A light-sensitive and heat-sensitive recording material was prepared in the same manner as in Example 1 except that the acylphosphine oxide compound (19) was changed to an acylphosphine oxide compound (1).

Comparative example 1

A light-sensitive and heat-sensitive recording material was prepared in the same manner as in Example 1 except that the acylphosphine oxide compound (19) was changed to 2,2-dimethoxy-1,2-diphenylethane-1-on.

Comparative example 2

A light-sensitive and heat-sensitive recording material was prepared in the same manner as in Example 1 except that no acylphosphine oxide compound (19) was used.

Evaluations of light-sensitive and heat-sensitive recording materials

Characteristic test of light-sensitive and heat-sensitive recording materials

A density of a recorded image and a density of a base portion density in each of the light-sensitive and heat-sensitive recording materials obtained by examples 1 to 5 and comparative examples 1 and 2 were evaluated.

Conditions for the evaluations will be described below. Image recording and fixing was conducted using a thermal head (KST type) manufactured by Kyocera Corp.

(1) An electric power applied to the thermal head and pulse width were adjusted so that the recording energy per unit area was 35 mJ/mm$^2$, and thermal printing was conducted on the light-sensitive and heat-sensitive recording material, and an image of yellow was thereby recorded thereon. Subsequently, the light-sensitive and heat-sensitive recording material was exposed under an ultraviolet ray lamp having an emission central wavelength of 420 nm and an output of 40 W for 10 seconds and the image was fixed thereon.

The obtained density of the recorded image and optical reflection yellow density of a base portion were measured by using an X-rite densitometer 10 minutes after the fixing. The results are shown in Table 1.

TABLE 1

| Light-sensitive and heat-sensitive recording materials | Density of recorded image | Density of base portion |
|---|---|---|
| Example 1 | 1.21 | 0.06 |
| Example 2 | 1.22 | 0.06 |
| Example 3 | 1.20 | 0.07 |
| Example 4 | 1.18 | 0.07 |

TABLE 1-continued

| Light-sensitive and heat-sensitive recording materials | Density of recorded image | Density of base portion |
|---|---|---|
| Example 5 | 1.21 | 0.07 |
| Comparative example 1 | 1.18 | 0.11 |
| Comparative example 2 | 1.19 | 0.12 |

As shown in Table 1, the light-sensitive and heat-sensitive recording materials of the present invention using acylphosphine oxide compounds are excellent in the density of a recorded image, and the density (yellow) of a base portion is extremely low, and therefore, the whiteness is improved. On the other hand, in comparative example 1 in which a conventional free radical generating agent is used, as compared with a case in which no free radical generating agent is used (comparative example 2), the density of a base portion becomes a little lower. However, the light-sensitive and heat-sensitive recording materials of the present invention using acylphosphine oxide compounds were remarkably improved in the density of the base portions thereof.

Example 6

(1) Preparation of substrates

Wood pulp comprised of 100 parts of LBKP was struck to pieces of 300 cc of Canadian freeness by using a double-disk refiner, and to the result were added 0.5 parts of epoxidated amide behenate, 1.0 parts of anion polyacrylamide, 0.1 parts of polyamidepolyamine epichlorohydrin, and 0.5 parts of cation polyacrylamide based on a bone-dry weight ratio to the pulp. A base paper having a basic amount of 100 g/m² was made by a Fourdrinier paper machine, and the surface was made by using polyvinylalcohol having a bone-dry weight ratio of 1.0 g/m², and calender processing was conducted to adjust the density at 1.0.

A wire side (reverse surface) of the above-described base paper was subjected to corona discharge processing, and thereafter, high-density polyethylene having a resin thickness of 30 μm was applied onto the paper by using a fusion extruder, to form a resin layer comprised of a mat surface (which surface is called a reverse surface). The reverse surface with polyethylene applied thereon was subjected to corona discharge processing, and thereafter, aluminum oxide (trade name: Aluminasol 100, manufactured by Nissan Chemical Industries, Ltd.) and silicon dioxide (trade name: Snowtex O, manufactured by Nissan Chemical Industries, Ltd.) were dispersed in water at a weight ratio of ½ (aluminum oxide/silicon dioxide) to form an antistatic agent, and the obtained dispersion was applied by an amount of 0.2 g/m² in terms of weight after drying (the obtained product is called a reverse-side PE-laminated product).

Further, a felt side (front surface) of the base paper was subjected to corona discharge processing, and low-density polyethylene containing 10% by weight of titan dioxide and a very small amount of ultramarine blue was applied by fusion-extruding using a fusion extruder so that a resin thickness thereof becomes 40 μm, to form a resin layer comprised of a brightened surface (which surface is called a front surface). The polyethylene-applied front surface was subjected to corona discharge processing, and thereafter, gelatin was applied as an undercoat on the surface by an amount of 0.1 g/m² in terms of weight, after drying.

(2) Preparation of undercoat layer liquid

To 2.5 parts by weight of a swelling synthetic mica (trade name: ME100, manufactured by Co-op Chemical Co., Ltd.) was added 97.5 parts by weight of water, and they were dispersed by using a dynamill. The dispersion was added to 200 g of a 5% by weight aqueous solution of gelatin at 40° C. and stirred for 30 minutes. To this mixture was added 20 cc of the following surfactant—1 (5% by weight), to form an undercoat layer liquid.

Surfactant-1

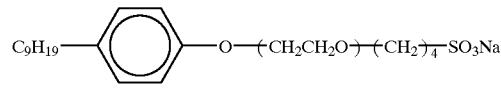

(3) Preparation of cyan heat-sensitive recording layer liquid Preparation of a capsule liquid containing electron-donating dye precursors A Liquid Into 20 parts of ethyl acetate was dissolved 5 parts of 3-(o-methyl-p-dimethylaminophenyl)-3-(1'-ethyl-2'-methylindole-3-yl)phthalide (electron-donating dye precursor), and to this solution was added 20 parts of alkylnaphthalene (high-boiling-point solvent), and they were heated and mixed uniformly.

To the obtained solution was added 20 parts of an adduct of xylylenediisocyanate and trimethylolpropane (⅓), and stirred uniformly, to obtain an A liquid.

B Liquid

To 54 parts of a 6% by weight aqueous solution of phthalated geletin was added 2 parts of a 2% by weight aqueous solution of sodium dodecilsulfonate, to obtain a B liquid.

A liquid was added to B liquid and the mixture was emulsified and dispersed by using a homogenizer, to obtain an emulsified dispersion. To the obtained dispersion was added 68 parts of water, and they were mixed to be made uniform. Thereafter, the mixed solution was heated to 50° C. while being stirred, and a micro-capsule forming reaction was conducted for 3 hours so that the average grain size of a micro capsule becomes 1.2 μm, to obtain a capsule liquid.

Preparation of developer emulsified dispersion

Into 10 parts of ethyl acetate were dissolved 2.5 parts of 1,1-(p-hydroxyphenyl)-2-ethylhexane (developer), 0.3 parts of tricresyl phosphate, and 0.1 parts of diethyl maleate. The obtained solution was placed in a solution in which 20 parts of 6% by weight aqueous solution of gelatin and 2 parts of a 2% by weight solution of sodium dodecylsulfonate are mixed, and was emulsified for 10 minutes using a homogenizer, to obtain an emulsified dispersion.

Preparation of coating liquid

To the previously-prepared capsule liquid containing electron-donating dye precursors was added 40% by weight of an SBR latex (trade name: SN-307, manufactured by Sumitomo Norgatak) in terms of solid capsule, and thereafter, to the mixture was added the developer emulsified dispersion at the weight ratio of ¼ to the capsule liquid containing electron-donating dye precursors, to obtain a cyan-layer coating liquid.

(4) Preparation of magenta heat-sensitive recording layer liquid Preparation of a capsule liquid containing diazo compound Into 20 parts of ethyl acetate was dissolved 2.0 parts of a diazo compound (1) (decomposed by light having a wavelength of 365 nm) represented by the following constitutional formula, and thereafter, to the mixture were added 20 parts of alkylnaphthalene and 0.4 parts of acylphosphine oxide compound (19), and they were heated and mixed uniformly. To the obtained solution was added 15 parts of an adduct (capsule wall agent) of xylylenediisocyanate and trimethylolpropane at the ratio of ⅓, and the resulting mixture was mixed uniformly, to obtain a solution of diazo compound.

The obtained solution of diazo compound was added to a solution in which 54 parts of 6% by weight aqueous solution of gelatin phthalate and 2 parts of 2% by weight aqueous solution of sodium dodecylsulfonate are mixed, and they were emulsified and dispersed by using a homogenizer.

To the obtained emulsified dispersion was added 68 parts of water, and they were mixed uniformly and heated to 40° C. while stirring. Then, a micro-capsule forming reaction was conducted for 3 hours so that the average grain size of a capsule becomes 1.2 μm, to obtain a capsule liquid.

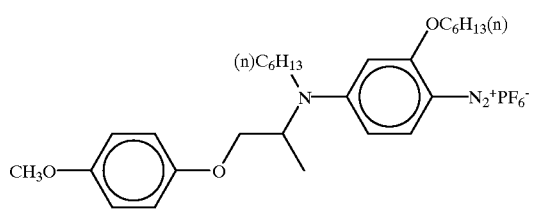

Preparation of coupler emulsified dispersion

Into 10 parts of ethyl acetate were dissolved 2 parts of a coupler (1) represented by the following constitutional formula, 2 parts of 1,2,3-triphenylguanidine, 0.3 parts of tricresyl phosphate, and 0.1 parts of diethyl maleate. The obtained solution was placed in an aqueous solution in which 20 parts of a 6% by weight aqueous solution of gelatin and 2 parts of a 2% by weight aqueous solution of sodium dodecylsulfonate are mixed, and thereafter, they were emulsified for 10 minutes by using a homogenizer to form an emulsified dispersion.

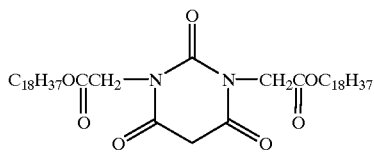

Preparation of coating liquid

To the previously prepared capsule liquid containing diazo compound was added 40% by weight of an SBR latex (trade name: SN-307, manufactured by Sumitomo Norgatak) in solid capsule form, and thereafter, a coupler emulsified liquid was mixed in the capsule liquid containing diazo compound at the weight ratio of ³⁄₂, to obtain a magenta-layer coating liquid.

(5) Preparation of yellow heat-sensitive recording layer liquid Preparation of a capsule liquid containing diazo compound Into 20 parts of ethyl acetate was dissolved 3.0 parts of 2,5-dibutoxy-4-tolylthiobenzenediazonium hexafluorophosphate (diazo compound: which is decomposed by light having a wavelength of 420 nm), and thereafter, to this mixture was added 20 parts of alkylnaphthalene and 0.4 parts of acylphosphine oxide compound (19) as high-boiling-point solvents, and they were heated and mixed uniformly.

To the obtained solution was added 15 parts of an adduct of xylylenediisocyanate and trimethylolpropane at the ratio of ⅓ as a capsule wall agent, and they were mixed uniformly, to obtain a diazo compound solution.

The obtained diazo compound solution was added to a solution in which 54 parts of a 6% by weight aqueous solution of gelatin phthalate and 2 parts of aqueous solution of sodium dodecylsulfonate are mixed, and the mixture was emulsified and dispersed using a homogenizer.

To the obtained emulsified dispersion was added 68 parts of water, and they were mixed uniformly. The obtained solution was heated to 40° C. while stirring, and a micro-capsule forming reaction was conducted for 3 hours so that the average grain size of a capsule becomes 1.3 μm, to obtain a capsule liquid.

Preparation of coupler emulsified dispersion

Into 10 parts of ethyl acetate were dissolved 2 parts of 2-chloro-5-(3-(2,4-di-tert-pentyl)phenoxypropylamino) acetacetanilide, 1 parts of 1,2,3-triphenylguanidine, 0.3 parts of tricresyl phosphate, and 0.1 parts of dietyl maleate, and the obtained solution was placed in an aqueous solution in which 20 parts of a 6% by weight aqueous solution of gelatin and 2 parts of a 2% by weight aqueous solution of sodium dodecylsulfonate are mixed, and this mixture was emulsified for 10 minutes by using a homogenizer, to obtain an emulsified dispersion.

Preparation of coating liquid

The previously prepared coupler emulsified dispersion was mixed with the capsule liquid containing diazo compound at a ratio of ³⁄₂ by weight, and a yellow-layer coating liquid was thereby obtained.

(6) Preparation of intermediate layer liquid

To 10 parts of a 15% by weight aqueous solution of gelatin (trade name: #750, manufactured by Nitta Gelatin) was added 3 parts of 15% by weight aqueous solution of polyacrylate (trade name: Jurimar AC-10L, manufactured by Nippon Junyaku), and they were mixed uniformly, to obtain an intermediate layer liquid.

(7) Preparation of coating liquid for light transmittance adjusting layer 1.5 parts of the following compound and 0.5 parts of R-6 (reducing agent) were mixed with and sufficiently dissoved into 6.0 parts of ethyl acetate and 0.8 parts of tricresyl phosphate. To the solution was added 3.0 parts of xylylenediisocyanate/trimethylolpropane (a 75% solution of ethyl acetate; trade name: Takenate D110N, manufactured by Takeda Chemical Industries Ltd.), and they were stirred and made uniform. 29.7 parts of an 8% by weight aqueous solution of carboxy-modified polyvinyl alcohol (trade name: KL-318, manufactured by Kuraray Co., Ltd.) was prepared and added to the above-described solution, and the resultant mixture was emulsified and dispersed by using a homogenizer. The obtained emulsified liquid was added to 40 parts of ion exchange water and stirred for 3 hours at 40° C., and a micro-capsule forming reaction was conducted. Thereafter, to this liquid was added 7.0 parts of ion exchange resin (trade name: Amberlite MB-03, manufactured by Organo Corp.), and they were further stirred for one hour. A liquid intended for coating was thus prepared. The average grain size of a capsule was 0.35 μm.

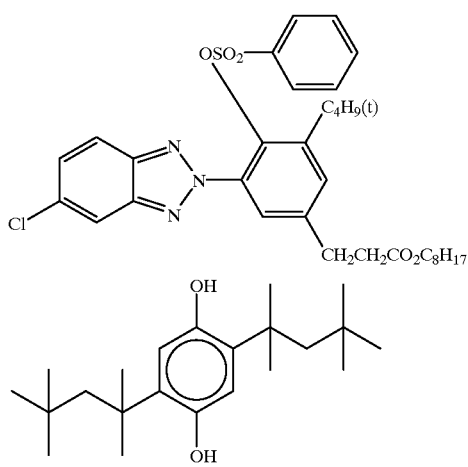

R-6

(8) Preparation of protective layer liquid

| | |
|---|---|
| EP130 (7% by weight) | 100 g |
| Water | 50 g |
| BARIFINE BF21 dispersion (20% by weight) | 10 g |
| Surfactant-1 (2% by weight) | 5 ml |
| Surfactant-2 (5% by weight) | 5 ml |

"EP130" is dodecyl-modified polyvinyl alcohol manufactured by Denki Kagaku Kogyo K.K., and "BARIFINE BF21 dispersion" is ultra-fine grains of barium sulfate manufactured by Sakai Chemical Industry Co., Ltd. The above-described surfactant-2 is represented by the following constitutional formula.

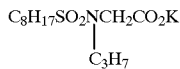

(9) Preparation of light-sensitive and heat-sensitive recording material

The undercoat-layer liquid, cyan heat-sensitive recording layer liquid, intermediate layer liquid, magenta heat-sensitive recording layer liquid, intermediate layer liquid, yellow heat-sensitive recording layer liquid, light transmittance adjusting layer liquid, and protective layer liquid were applied onto the front surface of a polyethylene-laminated paper substrate in this order from the substrate in a multi-layered form, and dried to obtain a multi-colored light-sensitive and heat-sensitive recording material.

Respective amounts of the liquids for the undercoat layer, cyan heat-sensitive recording layer, intermediate layer, magenta heat-sensitive recording layer, intermediate layer, yellow heat-sensitive recording layer, light transmittance adjusting layer, and protective layer were 1.0 g/m², 6.1 g/m², 1.0 g/m², 7.8 g/m², 1.0 g/m², 7.2 g/m², 1.5 g/m², and 1.2 g/m², respectively.

Example 7

A light-sensitive and heat-sensitive recording material was prepared in the same manner as in Example 6 except that an acylphosphine oxide compound (2) was used in place of the acylphosphine oxide compound (19), and added to the magenta heat-sensitive recording layer liquid and the yellow heat-sensitive recording layer.

Comparative example 3

A light-sensitive and heat-sensitive recording material was prepared in the same manner as in Example 6 except that 2,2-dimethoxy-1,2-diphenylethane-1-on was used in place of the acylphosphine oxide compound (19).

Comparative example 4

A light-sensitive and heat-sensitive recording material was prepared in the same manner as in Example 6 except that no acylphosphine oxide compound (19) was used.

Evaluations of full-color light-sensitive and heat-sensitive recording materials The density of a recorded image and density of a base portion for each of the full-color light-sensitive and heat-sensitive recording materials obtained by examples 6 and 7 and comparative examples 3 and 4 were evaluated in such a manner as described below. Conditions for the evaluations are described below. Image recording was conducted by using a thermal head (KST type) manufactured by Kyocera Corp.

(1) An electric power applied to the thermal head and pulse width were adjusted so that the recording energy per unit area was 35 mJ/mm², and image recording was conducted on the light-sensitive and heat-sensitive recording material, to allow recording of an yellow image. Thereafter, the light-sensitive and heat-sensitive recording material was exposed under an ultraviolet ray lamp having an emission central wavelength of 420 nm and an output of 40 W for 10 seconds, and the image was fixed thereon.

(2) In the same manner as described above, image recording was conducted on the light-sensitive and heat-sensitive recording material so that the recording energy per unit area was 80 mJ/mm², and a magenta image was thereby recorded thereon. Thereafter, the light-sensitive and heat-sensitive recording material was exposed under an ultraviolet ray lamp having an emission central wavelength of 365 nm and an output of 40 W for 10 seconds, and the image was fixed thereon.

(3) Finally, image recording was conducted on the light-sensitive and heat-sensitive recording material so that the recording energy per unit area was 140 mJ/mm², and a cyan image recorded thereon.

The density of the obtained recorded image and the optical reflection yellow density of a base portion were measured using an X-rite densitometer 10 minutes after fixing. The results are shown in Table 2.

TABLE 2

| | Density of recorded image | | | Density of base portion |
|---|---|---|---|---|
| | yellow | Magenta | cyan | yellow |
| Example 6 | 1.44 | 1.58 | 1.60 | 0.06 |
| Example 7 | 1.44 | 1.57 | 1.61 | 0.07 |
| Comparative example 3 | 1.42 | 1.57 | 1.58 | 0.12 |
| Comparative example 4 | 1.41 | 1.57 | 1.60 | 0.13 |

As shown in Table 2, the light-sensitive and heat-sensitive recording materials of the present invention using acylphosphine 1oxide compounds are excellent in the density of the recorded image, densities of base portions (yellow) thereof are extremely low, and the whiteness has thereby been improved. On the other hand, in the comparative example 3 using a conventional free radical generating agent, the density of the base portion is a little lower than that of the light-sensitive and heat-sensitive recording material using no free radical generating agent (comparative example 4). However, the light-sensitive and heat-sensitive recording materials of the present invention using acylphosphine oxide compounds were remarkably improved in the density of the base portions.

Example 8

Preparation of micro-capsule liquid

Into 5 parts of ethyl acetate were added and dissolved 2 parts of diazonium salt represented by the following constitutional formula, 1 parts of a sulfone derivative represented by the following consitutional formula, 1 parts of a bisphenol derivative represented by the following consitutional formula, and 0.2 parts of acylphosphine oxide compound (19).

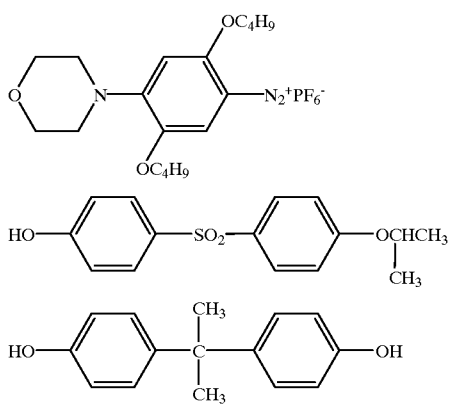

To the solution of a diazonium compound and the like was added 5 parts of aromatic isocyanate (trade name: Barnock D-750, manufactured by Dainippon Ink and Chemicals, Inc.), and they were stirred and mixed. The ethyl acetate solution thus obtained, which contains diazonium salt, isocyanate, and the above-described compounds, was mixed in an aqueous solution of 1 parts of polyvinyl alcohol (trade name: PVA217E, manufactured by Kuraray Co., Ltd.) being dissolved in 10 parts of water, and emulsified and dispersed, to obtain an emulsified liquid having an average grain size of 1.0 μm.

To the obtained emulsified solution was added 10 parts of water, and heated to 40° C. while stirring, to allow reaction of isocyanate, which is wall forming material, for 3 hours. As a result, a micro-capsule was obtained which has an average grain size of 1 μm and contain, as core materials, a diazo compound and the compounds represented by the above-described constitutional formulae. The above-described micro-capsule forming reaction was conducted under reduced pressure of 400 mmHg to 500 mmHg using a water jet pump.

Preparation of coupler dispersion

To 100 parts of a 5% by weigth aqueous solution of polyvinyl alcohol were added 5 parts of 2-hydroxy-3-anilide naphthoate and 5 parts of triphenylguanidine, and the mixture was dispersed using a sand mill for 24 hours, to obtain a dispersion having an average grain size of 2 μm.

Preparation of coating liquid

To 10 parts of the above-described capsule liquid of diazonium salt were added 25 parts of the above-described coupler dispersion, 10 parts of a 40% by weight dispersion of calcium carbonate (trade name: Univer 70, manufactured by Shiraishi Kogyo), 5 parts of a 20% by weight dispersion of amide stearate, and 2 parts of a 40% by weight dispersion of 3,5-di-α-methylbenzyl zinc salicylate, to obtain a coating liquid.

Preparation of recording material

The above-described coating liquid was applied on a smooth high quality paper (76 g/m$^2$) using a coating bar by an amount of 5 g/m$^2$ in terms of weight after drying, and dried for 3 minutes at 50° C., to obtain a recording material.

Comparative example 5

A recording material was prepared in the same manner as in Example 8 except that no acylphosphine oxide compound was used.

Evaluations of recording materials

Optical writing was conducted on the recording materials obtained by example 8 and comparative example 5, and thereafter, the entire surface of each recording material was heated to allow formation of an image thereon. The optical writing was conducted by irradiation with light for 30 seconds using a fluorescent lamp having an output of 10 mW/cm$^2$. The heating was conducted by applying a heat plate of 150° C. for 5 seconds onto each of the recording materials. The density of the image portion and the density of the base portion were measured in the same manner as in Example 1. The results are shown in Table 3.

TABLE 3

|  | Density of recorded image | Density of base portion |
| --- | --- | --- |
| Example 8 | 1.83 | 0.06 |
| Comparative example 5 | 1.81 | 0.13 |

As shown in Table 3, the recording material obtained by example 8 is excellent in density of the recorded image and the density of the base portion thereof is extremely low. On the other hand, in the recording material using no acylphosphine oxide compound obtained by comparative example 5, the density of a base portion is high and the whiteness is thereby inferior (although a satisfactory result in the density of the recorded image can be obtained).

In the light-sensitive and heat-sensitive recording material of the present invention, a specified compound, that is, an acylphosphine oxide compound, is used as a free radical generating agent. Accordingly, the whiteness of the base portion, which is not produced when using a conventional free radical generating agent, can be improved. Further, the density of a recorded image is also excellent.

What is claimed is:

1. A light-sensitive and heat-sensitive recording material for use in recording an image thereon, the heat-sensitive recording layer comprising:

(a) a substrate; and (b) a recording layer disposed on the substrate, the recording layer containing micro-capsules having a diazonium salt compound therein, along with an acylphosphine oxide compound, and a coupler reactive with the diazonium salt compound.

2. A light-sensitive and heat-sensitive recording material according to claim 1, wherein the acylphosphine oxide compound is at least one compound selected from compounds consisting of the group represented by general formulae (1) and (2):

General formula (1)

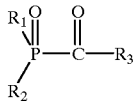

General formula (2)

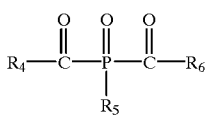

wherein, $R_1$, $R_2$, and $R_5$ each represent a group selected from the group consisting of an alkyl group, aryl group, alkoxy group, aryloxy group, and a heterocyclic group, and $R_3$, $R_4$, and $R_6$ each represent a group selected from the group consisting of an alkyl group, aryl group, and a heterocyclic group.

3. A light-sensitive and heat-sensitive recording material according to claim 1, wherein an amount of the acylphosphine oxide compound is in a range from 1 to 50% by weight based on the total weight of the diazonium salt compound.

4. A light-sensitive and heat-sensitive recording material according to claim 1, wherein an amount of the acylphosphine oxide compound is in a range from 5 to 20% by weight based on the total weight of the diazonium salt compound.

5. A light-sensitive and heat-sensitive recording material according to claim 1, wherein the maximum absorption wavelength $\lambda_{max}$ of the diazonium salt compound is 450 nm or less.

6. A light-sensitive and heat-sensitive recording material according to claim 1, wherein the maximum absorption wavelength $\lambda_{max}$ of the diazonium salt compound is in a range from 290 to 440 nm.

7. A light-sensitive and heat-sensitive recording material according to claim 1, wherein the diazonium salt compound has 12 or more carbon atoms, and a solubility thereof in water is 1% or less and a solubility thereof in ethyl acetate is 5% or more.

8. A light-sensitive and heat-sensitive recording material according to claim 1, wherein the diazonium salt compound is represented by any one of the following constitutional formulae (2), (3), and (4):

Constitutional formula (2)

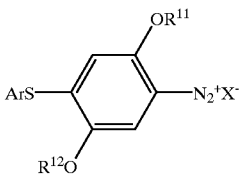

Constitutional formula (3)

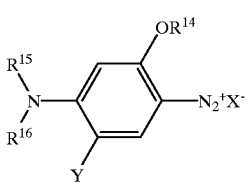

Constitutional formula (4)

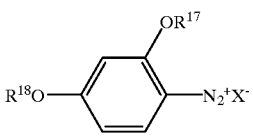

wherein Ar represents a substituted or unsubstituted aryl group; $R^{11}$, $R^{12}$, $R^{14}$, $R^{15}$, $R^{16}$, $R^{17}$ and $R^{18}$ each represent a substituted or unsubstituted alkyl group or a substituted or unsubstituted aryl group; Y represents a hydrogen atom or $-OR^{13}$ group, wherein $R^{13}$ represents a substituted or unsubstituted alkyl group or a substituted or unsubstituted aryl group; and $X^-$ represents an acid anion.

9. A light-sensitive and heat-sensitive recording material according to claim 1, wherein a grain size of the microcapsule is in a range from 0.1 to 1.0 μm.

10. A light-sensitive and heat-sensitive recording material according to claim 1, wherein a grain size of the microcapsule is in a range from 0.2 to 0.7 μm.

11. A light-sensitive and heat-sensitive recording material according to claim 1, wherein said light-sensitive and heat-sensitive recording material contains a basic material.

12. A light-sensitive and heat-sensitive recording material according to claim 1, wherein said light-sensitive and heat-sensitive recording material is a full-color light-sensitive and heat-sensitive recording material.

* * * * *